(12) United States Patent
Furumai et al.

(10) Patent No.: US 6,854,897 B2
(45) Date of Patent: Feb. 15, 2005

(54) FERRULE PART AND OPTICAL COMMUNICATIONS MODULE

(75) Inventors: Masaki Furumai, Osaka (JP); Shuzo Suzuki, Yokohama (JP); Hitoshi Terauchi, Osaka (JP); Manabu Yoshimura, Yokohama (JP); Kazuhito Saito, Yokohama (JP); Manabu Shiozaki, Yokohama (JP); Kazunori Yoshida, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/390,187

(22) Filed: Mar. 18, 2003

(65) Prior Publication Data

US 2003/0223701 A1 Dec. 4, 2003

(30) Foreign Application Priority Data

Mar. 18, 2002 (JP) .................................... P2002-074918
Mar. 14, 2003 (JP) .................................... P2003-070519

(51) Int. Cl.⁷ .............................................. G02B 6/38
(52) U.S. Cl. ..................................................... 385/73
(58) Field of Search ........................ 385/70–73, 49–52, 385/89–94

(56) References Cited

U.S. PATENT DOCUMENTS

| 5,808,293 | A  |   | 9/1998  | Yang                    |
|-----------|----|---|---------|-------------------------|
| 5,841,562 | A  | * | 11/1998 | Rangwala et al. 398/139 |
| 5,940,558 | A  | * | 8/1999  | Bishop et al. 385/52    |
| 6,485,191 | B1 | * | 11/2002 | Sato 385/73             |
| 6,513,993 | B1 | * | 2/2003  | Nakanishi et al. 385/92 |

* cited by examiner

*Primary Examiner*—Tulsidas C. Patel
(74) *Attorney, Agent, or Firm*—McDermott Will & Emery LLP

(57) ABSTRACT

The ferrule part 16 comprises ferrule 60, first and second optical fibers 62 and 64, and optical filter 68. Ferrule 60 has first and second end surface 60a and 60b, ferrule insertion hole 60c, and groove 68. Ferrule insertion hole 60c extends along a first axis, and accommodates first and second optical fibers 62 and 64. Groove 66 extends along a second axis crossing the first axis, and extends so as to extend across ferrule 60. Groove 66 is provided along a plane defined by the second axis and a third axis perpendicular to the first and second axes. Optical filter 68 can reflect a part of light incident on one surface 68b of the pair of surfaces of optical filter 68, and can transmit a part of the light incident on other surface 68a.

20 Claims, 29 Drawing Sheets

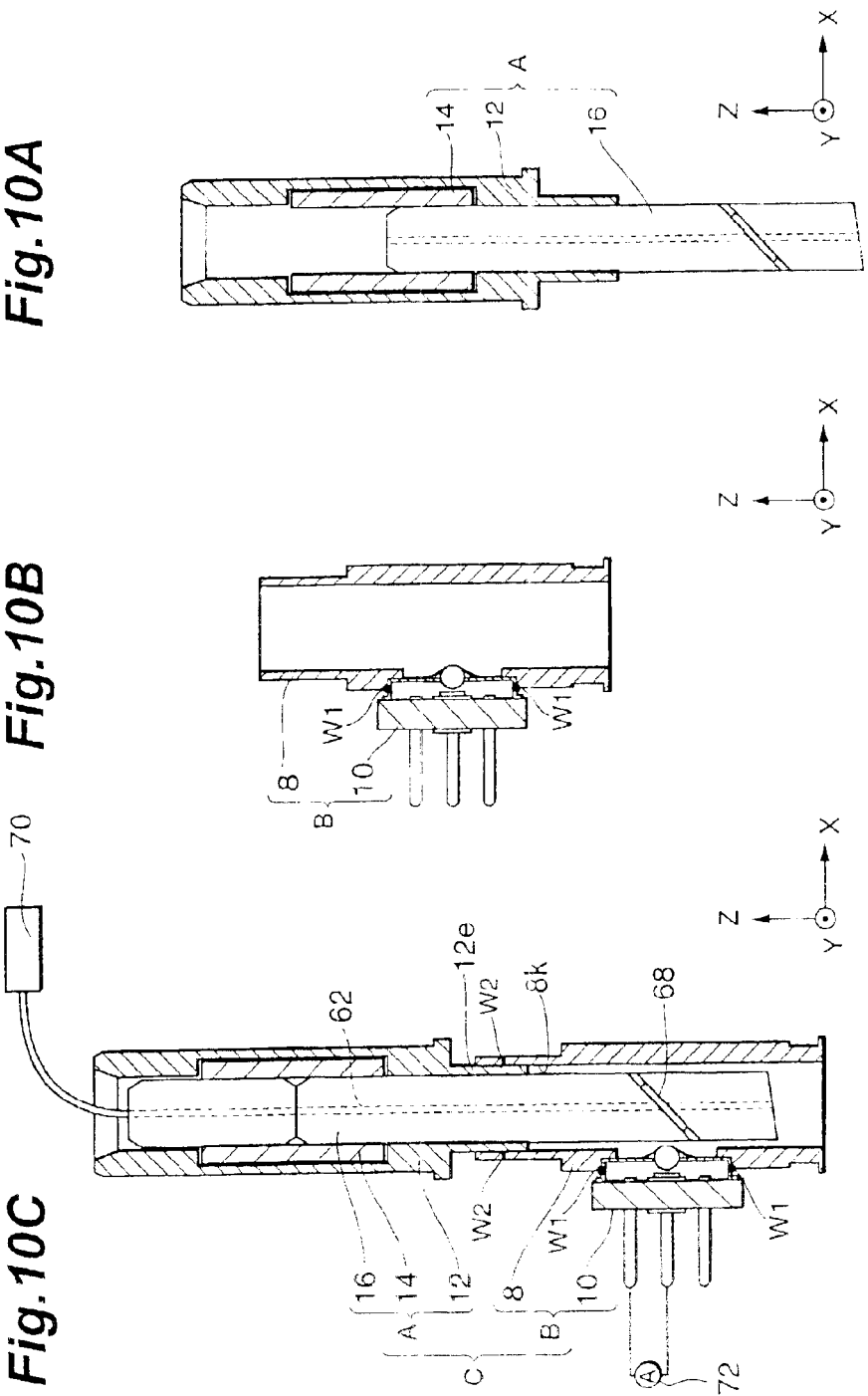

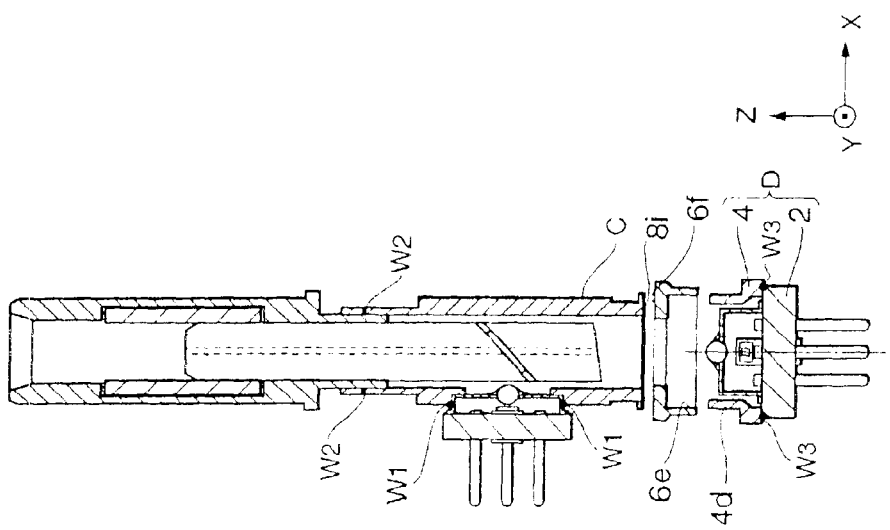
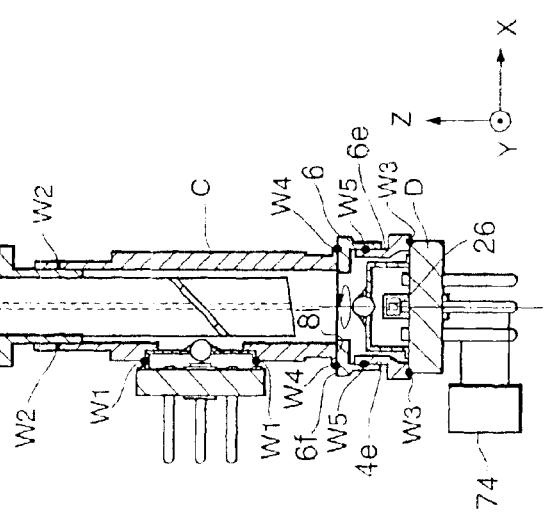

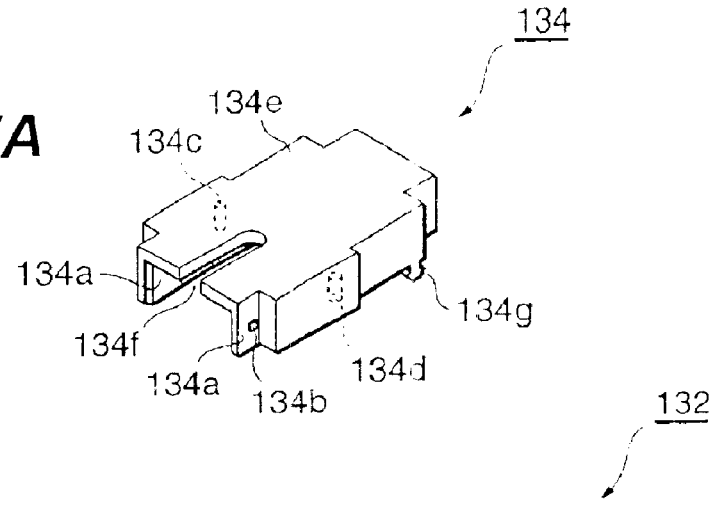
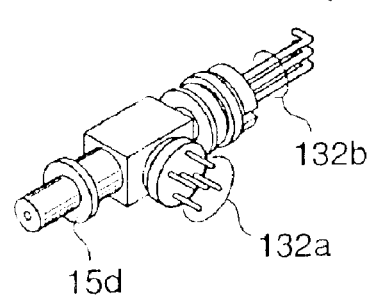
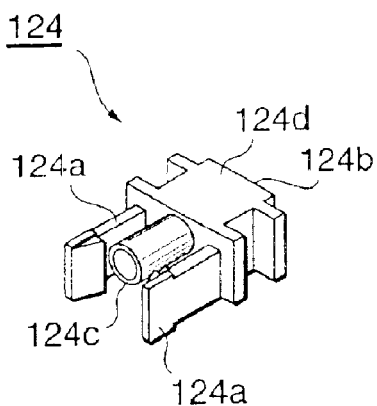
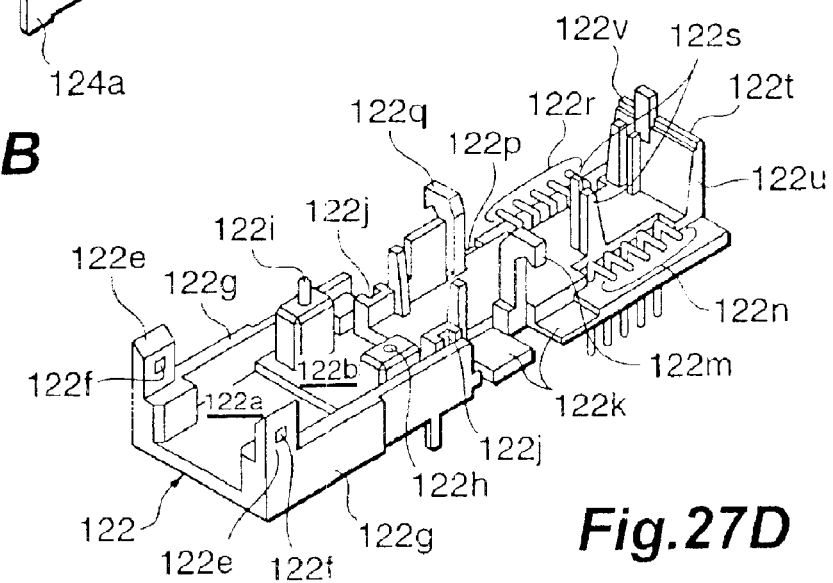

FERRULE PART AND OPTICAL COMMUNICATIONS MODULE

BACKGROUND OF THE INVENTION

1. Field of the Invention

The present invention relates to a ferrule part and an optical communications module.

2. Related Background Art

One type of optical transceivers comprises a receptacle, a transmitting sub-assembly, a receiving sub-assembly and a housing. The receptacle receives optical connector plugs provided on one end of each of a pair of optical fibers. The housing accommodates these parts. The transmitting sub-assembly transmits light signals to one optical fiber of the pair of optical fibers via the corresponding optical connector plug. The receiving sub-assembly receives light signals from the other optical fiber of the pair of optical fibers via the corresponding optical connector plug.

SUMMARY OF THE INVENTION

The U.S. Pat. No. 5,841,562 publication discloses a bidirectional fiber optic communication system. The bidirectional fiber optic communication system comprises two ferrules each having an oblique surface and does not include an optical part, such as an optical filter. In one embodiment of the splitter function in a bidirectional fiber optic communication system, the interior ends of ferrules (reference numerals 32 and 34 in the publication) each have oblique surfaces (reference numeral 50 in the publication) oriented at about 45 degrees and parallel to one another. Likewise the interior ends of the fiber (reference numeral 33 in the publication) and the fiber end portion (reference numeral 60.1 in the publication) also have oblique surfaces oriented at about 45 degrees.

FIG. 29 is a view showing the structure of a bi-directional optical module used in the present inventors' technical investigations. Referring to FIG. 29, the bi-directional optical module 201 comprises an optical fiber 202, an optical filter 203, a light receiving lens 204, a semiconductor light receiving element 205, a first lens 206, a second lens 207, a semiconductor laser element 208, and a package 209.

The structure of the optical module 201 is complex. For example, the optical fiber 202, optical filter 203 and semiconductor light receiving element 205 have to be aligned with each other in order to supply light from the optical fiber 202 to the receiving sub-assembly. Furthermore, the optical fiber 202, the lenses 206 and 207 and the semiconductor laser element 208 have to be aligned with each other in order to supply light from the transmitting sub-assembly to the optical fiber 202. Moreover, the alignment of the optical fiber 202 to the semiconductor laser element 208 via the optical filter 203 makes the manufacturing process complex. What is needed is a bi-directional optical communications module having a structure that allows the alignment of the optical fiber with respect to the transmitting sub-assembly without the interposition of an optical part, such as an optical filter, in a bi-directional optical module. Accordingly, the present inventors conducted research in order to obtain a structure that allows the simple alignment of the transmitting sub-assembly, receiving sub-assembly, optical filter and optical fiber with each other.

Therefore, it is an object of the present invention to provide a ferrule part having a structure that allow the alignment of an optical fiber with a transmitting sub-assembly without the interposition of an optical part, and an optical communications module including the ferrule part.

One aspect of the present invention is a ferrule part. The ferrule part comprises a ferrule, an optical part, a first optical fiber, and a second optical fiber. The ferrule has first and second end faces and a groove. The first and second end surfaces intersect a first axis. The groove extends along a second axis. The second axis intersects the first axis. The optical part is provided in the groove so as to intersect the first axis. The optical part has a pair of surfaces. The first optical fiber is supported in the ferrule. The first optical fiber has one end facing the one surface of the optical part. The second optical fiber is supported in the ferrule, the second optical fiber has one end facing the other face of the optical part. The groove is provided along a plane defined by the second axis and a third axis. The third axis is perpendicular to the first and second axes. The groove extends across the ferrule along the second axis. The optical part is capable of reflecting a part of light incident on the one surface of the pair of surfaces of the optical part. The optical part is capable of transmitting a part of light incident on the one surface of the optical part. The ferrule is made of material that is capable of transmitting light propagating in the first and second optical fibers.

In the ferrule part, the optical part includes an optical filter. The optical filter is capable of transmitting light of a first wavelength component of light propagating in the first and second optical fibers. The optical filter is capable of reflecting light of a second wavelength component of light propagating in one of the first and second optical fibers. In the ferrule part, the optical part may include a half-mirror. In the ferrule part, the optical part may include a WDM filter. In the ferrule part, the groove has a pair of side surfaces extending along the plane. The ferrule has a hole extending in a direction of the first axis. The hole has first and second portions. The first portion extends from the first end face of the ferrule to the one side face of the groove. The second portion extends from the second end face of the ferrule to the other side face of the groove. In the ferrule part, the ferrule comprises a depression provided in the side surfaces thereof. The groove extends across the depression. In the ferrule part, the ferrule comprises a depression provided in the side surface thereof. The depression comprises a pair of edges extending in a direction of the first axis, and a surface extending from one of the pair of edges to the other edge. The groove extends from one of the pair of edges of the depression to the other edge, and extends across the surface of the depression. The groove has a pair of ends provided at each edge of the depression. The one end of the groove is provided on the one edge of the depression at a position that differs from that of an intersection between the other edge of the depression and a perpendicular line dropped from a position of the other end of the groove to the one edge of the depression. In the ferrule part, the ferrule comprises another depression provided in the side surface thereof. The other depression comprises a surface intersecting the surface of the depression.

In the ferrule part, the ferrule may be made of optical glass.

In the ferrule part, the first axis may intersect the second axis to form an acute angle.

The ferrule part further comprises a sleeve holding the ferrule. The sleeve is positioned with respect to the first end face of the ferrule. The optical part is positioned with respect to the first end face of the ferrule.

According to another aspect of the present invention, an optical communications module comprises a ferrule part, a receiving sub-assembly, and a transmitting sub-assembly. The receiving sub-assembly is optically coupled to the optical part of the ferrule part. The transmitting sub-assembly is optically coupled to the first optical fiber at the first end face of the ferrule part. The optical communications module further comprises a holding member having a receiving hole and a positioning hole. The receiving hole extends in a direction of a predetermined axis and receives the ferrule part therein. The positioning hole is provided to extend in a direction of an axis intersecting the predetermined axis. The positioning hole communicates with the receiving hole. The positioning hole is provided to position the receiving sub-assembly.

According to still another aspect of the present invention, an optical communications module comprises a ferrule part, a receiving sub-assembly, a transmitting sub-assembly, and a holding member. The receiving sub-assembly is optically coupled to the optical part of the ferrule part. The transmitting sub-assembly is optically coupled to the first optical fiber at the first end face of the ferrule part. The holding member has a receiving hole and a positioning hole. The receiving hole extends in a direction of a predetermined axis and receives the ferrule part therein. The positioning hole is provided to extend in a direction of an axis intersecting the predetermined axis. The positioning hole communicates with the receiving hole. The positioning hole is provided to position the receiving sub-assembly. The holding member has a side face extending in a direction of the predetermined axis. The side face has a positioning portion. The positioning portion of the holding member positions the sleeve of the ferrule part.

The optical communications module further comprises a positioning member having a mounting surface. The mounting surface extends along a plane intersecting the predetermined axis. The holding member comprises an end portion having a sliding surface. The sliding surface extends along a plane intersecting the predetermined axis. The sliding surface faces the mounting surface of the positioning member. In the optical communications module, the ferrule part has a sleeve holding the ferrule. The holding member has a holding portion and a positioning portion. The holding portion and the positioning portion are provided in a direction of the predetermined axis. The holding portion has first and second ends. The receiving hole extends from the first end of the holding portion to the second end thereof. The positioning portion has a guide hole guiding the sleeve. The guide hole communicates with the receiving hole at the second end.

In the optical communications module, a gap is provided between the ferrule part and an inner surface of the receiving hole of the holding member.

The optical communications module further comprises a positioning member having a side face. The side face extends in a direction of the predetermined axis. The transmitting sub-assembly comprises a mounting member, a semiconductor light generating element mounted on the mounting member, and a lead terminal provided in the mounting member. The lead terminal is connected to the semiconductor light generating element. The optical communications module further comprises a guide member mounted on the mounting member. The guide member has a guide surface extending in a direction of the predetermined axis. The guide surface faces the side face of the positioning member. In the optical communications module, the receiving sub-assembly has a mounting member for mounting a semiconductor light receiving element, a cover member mounted on the mounting member, and a lead terminal provided in the mounting member. The lead terminal is connected to the semiconductor light receiving element. The semiconductor light receiving element receives light reflected by the optical part. In the optical communications module, the receiving sub-assembly has another optical part provided between the semiconductor light receiving element and the optical part of the ferrule part. The cover member of receiving sub-assembly holds the other optical part. The other optical part includes one of an optical aperture and an optical filter.

The above and other objects of the present invention, as well as characterizing features and advantages of the present invention will easily be understood from the following detailed description of preferred embodiments of the present invention presented with reference to the attached figures.

BRIEF DESCRIPTION OF THE DRAWINGS

FIGS. 10A to 10C are views showing the optical alignment in a manufacturing process of the optical communications module of the present embodiment;

FIGS. 11A and 11B are views showing the optical alignment in a manufacturing process of the optical communications module of the present embodiment;

FIG. 27A is a perspective view showing the housing;

FIG. 27B is a perspective view showing the latching part;

FIG. 27C is a perspective view showing the optical communications module;

FIG. 27D is a perspective view showing the base part;

DESCRIPTION OF THE PREFERRED EMBODIMENTS

Figure 1:
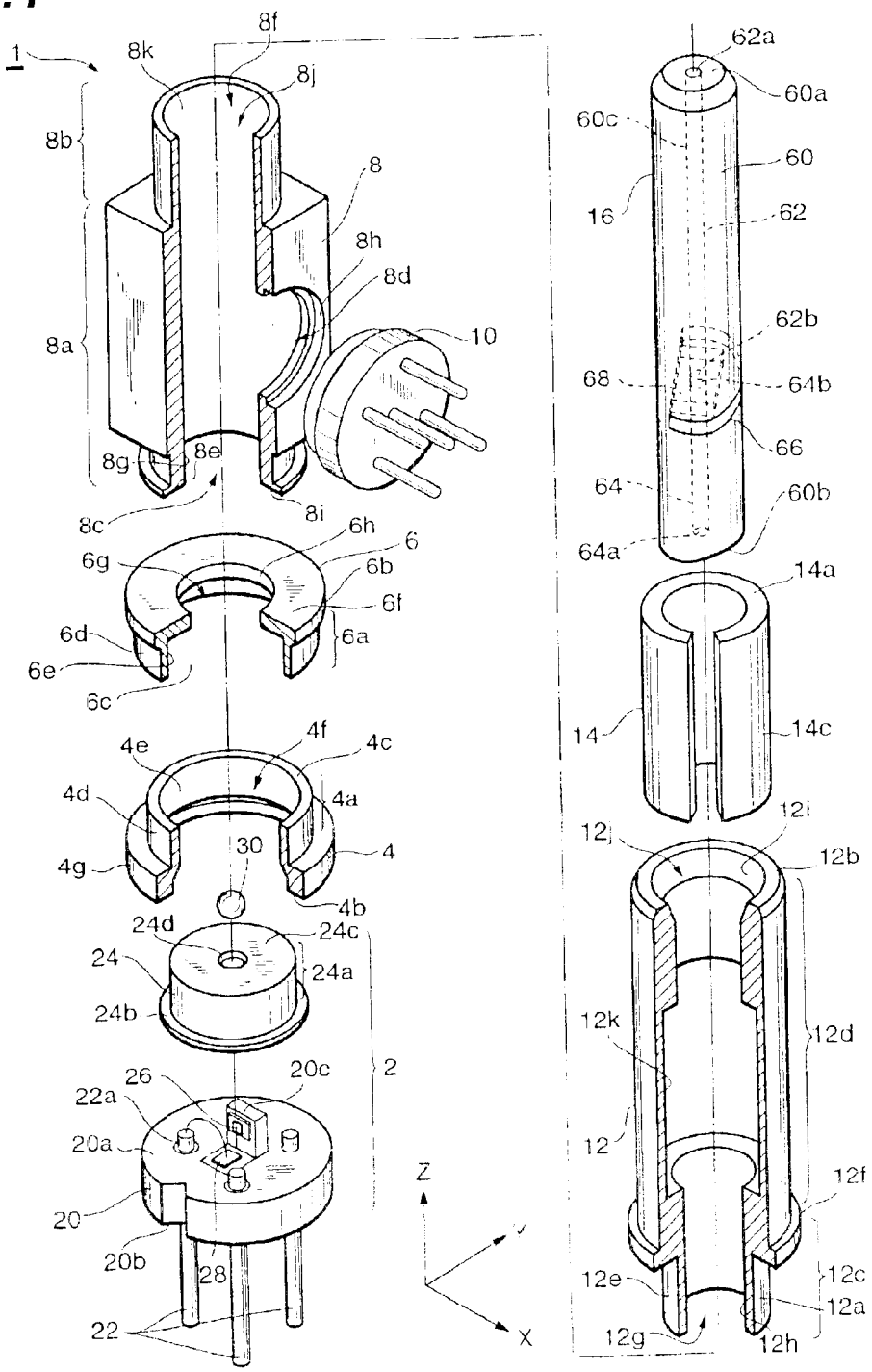
FIG. 1 is a perspective view showing the constituent parts of the optical communications module.

The teaching of the present invention can easily be understood by considering the following detailed description with reference to the accompanying drawings illustrated as examples. Embodiments of the present invention will be described with reference to the drawings. To facilitate understanding, identical reference numerals have been used, where possible, to designate identical elements that are common to the figures.

(First Embodiment)

Figure 2:
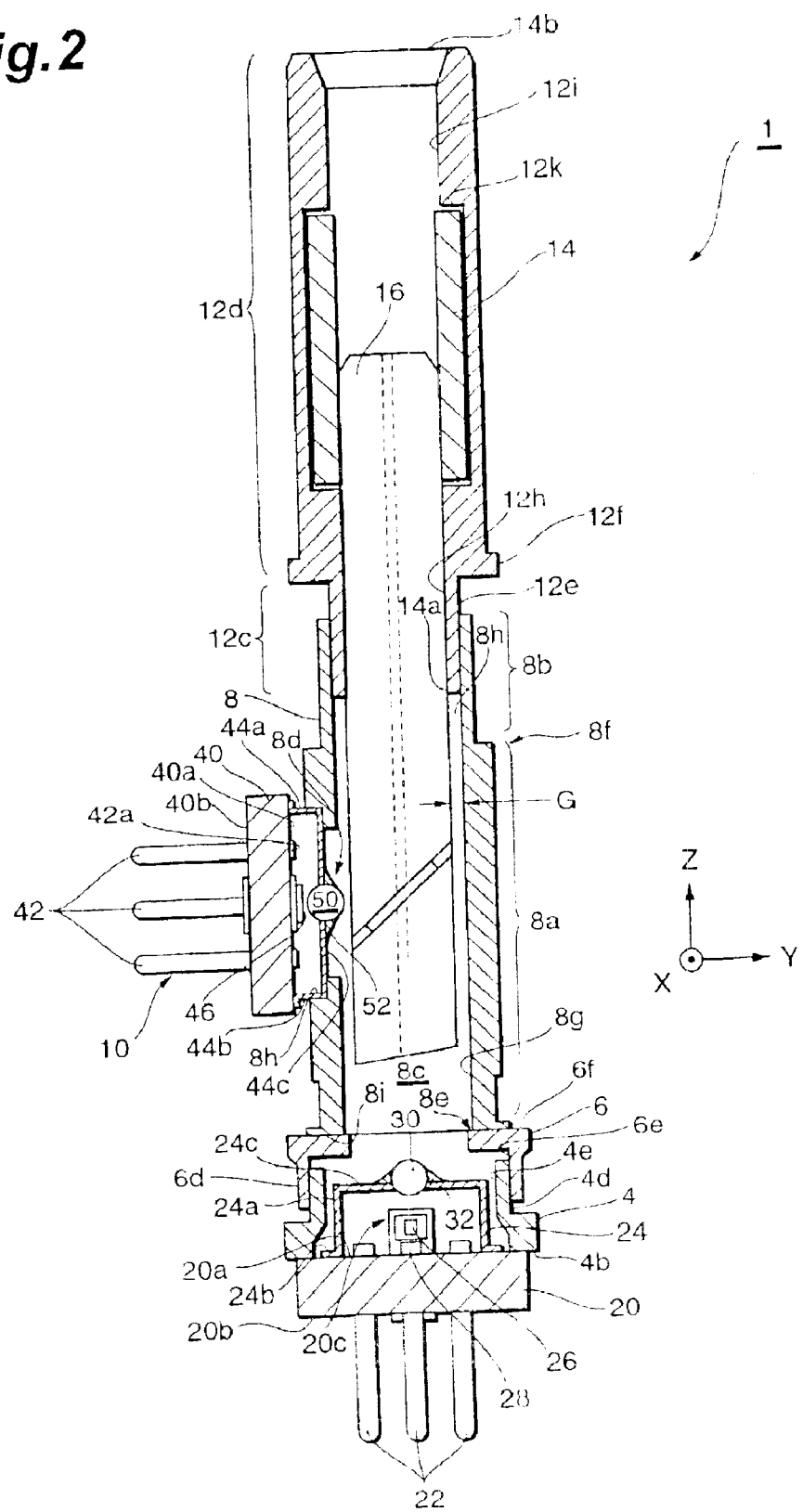
FIG. 2 is a sectional view showing the optical communications module.
Figure 3:
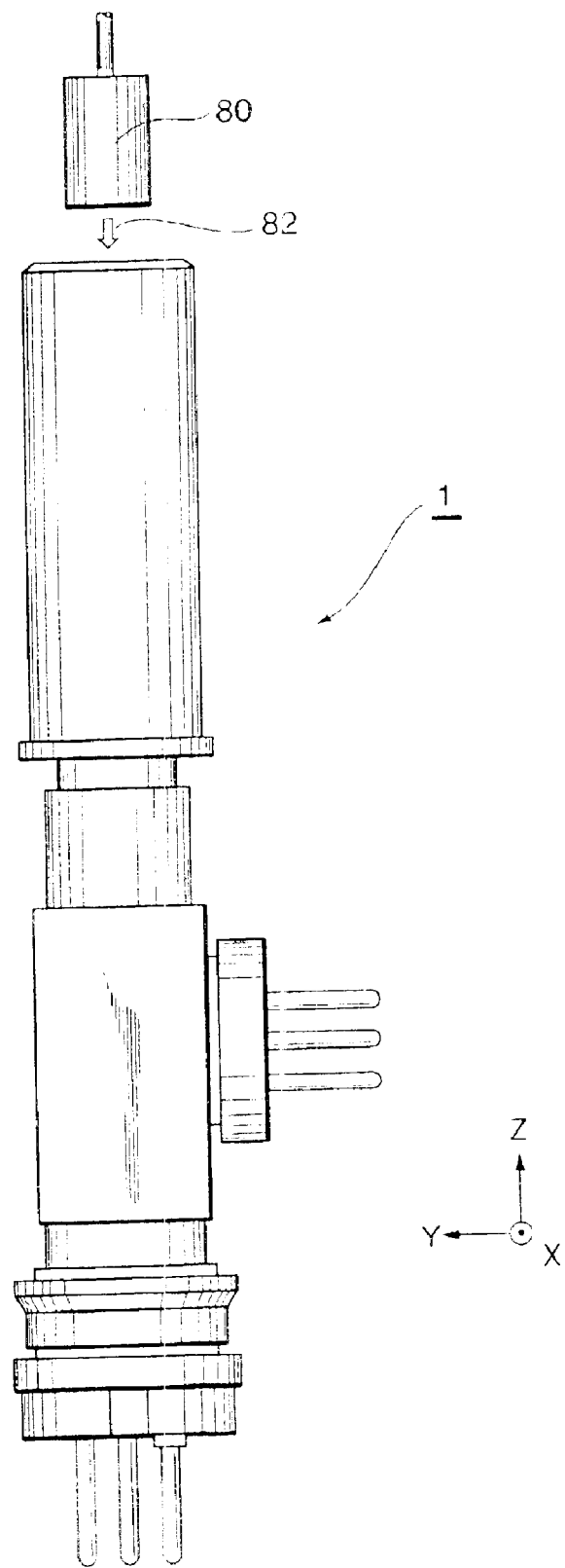
FIG. 3 is a side view showing the optical communications module.

FIG. 1 is a perspective view showing the constituent components of the optical communications module. FIG. 2 is a sectional view showing the optical communications module. FIG. 3 is a side view showing the optical communications module. In the following description, an optical communications module including the optical part, such as an optical filter, in the ferrule part will be described, but another optical part, such as a half-mirror, may be replaced with the optical filter in the optical communications module.

The optical communications module 1 comprises a transmitting sub-assembly 2, a guide member 4, a positioning member 6, a holding member 8, a receiving sub-assembly 10, a first sleeve 12, a second sleeve 14, and a ferrule part 16.

The transmitting sub-assembly 2 comprises a mounting member 20, a plurality of lead terminals 22, and a cover member 24 such as a cap. Each of the plurality of lead terminals 22 passes through the mounting member 20 from one face 20a to the other face 20b. A semiconductor light generating element 26, such as semiconductor laser element, is mounted on the mounting member 20. To describe this in detail, the semiconductor light generating element 26 is mounted through a member, such as a sub-mount, on an element mounting portion 20c provided on the face 20a. The semiconductor light generating element 26 has a pair of end faces. A semiconductor light receiving element 28, such as a photodiode, is provided so that this semiconductor light receiving element 28 is optically coupled with one end face of the semiconductor light generating element 26. The semiconductor light generating element 26 and semiconductor light receiving element 28 are connected via connecting members, such as bonding wires, to internal lead portions 22a that are provided to protrude from the face 20a. A cover member 24 is provided on the mounting member 20 so that this cover member 24 covers the semiconductor light generating element 26, semiconductor light receiving element 28 and internal lead portions 22a. The cover member 24 has a tubular portion 24a extending in a direction of a predetermined axis, a flange portion 24b provided at one end of the tubular portion 24a, a lens holding portion 24c provided at the other end portion of the tubular portion 24a, and a hole 24d provided in the lens holding portion 24c. The cover member 24 is provided on the mounting member 20 such that this flange portion 24b faces the surface 20a of the mounting member 20. A lens 30 is held in the hole 24d via a adhesive member (reference number 32 in FIG. 2).

The guide member 4 is mounted on the mounting member 20. The guide member 4 comprises a tubular portion 4a, a bonding face 4b, an opening 4c, outer side face 4d of the tubular portion, and inner side face 4e of the tubular portion. The tubular portion 4a extends along the predetermined axis. The bonding face 4b is provided on one end of the tubular portion 4a. The opening 4c is provided in the other end of the tubular portion 4a. The side faces 4d and 4c extend in a direction of the predetermined axis, respectively. The bonding face 4a faces the face 20a of the mounting member 20. The side faces 4d works as a guide face that face the side face 6e of the positioning member 6. The side face 4c defines a passage hole 4f through which light passes from the transmitting sub-assembly 2 to the ferrule part 16. A flange portion 4g may be provided on one end of the tubular portion 4a in order to provide the bonding face 4b farther toward the edge of mounting member 22.

The positioning member 6 comprises a tubular portion 6a, a flange portion 6b, an outer side face 6d of the tubular portion, and an inner side face 6e of the tubular portion. The tubular portion 6a extends in a direction of the predetermined axis. The flange portion 6b is provided on one end of the tubular portion 6a. The flange portion 6b comprises a mounting surface 6f and a passage hole 6g. The mounting surface 6f extends along a plane that intersects the predetermined axis. The passage hole 6g is provided in the center of the flange portion 6b so that light can pass through from the transmitting sub-assembly 2 to the ferrule part 16. The passage hole 6g is defined by side surface 6h provided such that the side surface 6h surrounds the predetermined axis. The opening 6c is provided in the other end of the tubular portion 6a. The side faces 6d and 6e extend in the direction of the predetermined axis, respectively. The side surface 6e works as a guide surface that faces the side face 4d of the guide member 4. Accordingly, one diameter of the inner and outer diameters of the tubular portion 4a of the guide member 4 is continuous with the other diameter of the outer and the inner diameters of the tubular portion 6a of the positioning member 6. Preferably, the above outer diameter is substantially equal to the above inner diameter.

The transmitting sub-assembly 2 and ferrule part 16 can be positioned to each other with respect to the Z axis by using the side face 6e of the positioning member 6 and the side face 4d of the guide member 4.

The holding member 8 has a holding portion 8a and a positioning portion 8b, which are provided in a direction of the predetermined axis. The holding portion 8a comprises an accommodating hole 8c and a positioning hole 8d. The holding member 8a further comprises a first end portion 8e and a second end portion 8f. The accommodating hole 8c extends from the first end portion 8e to the second end portion 8f of the holding member 8. Furthermore, the accommodating hole 8c extends in a direction of the predetermined axis, and is provided so as to accommodate the ferrule part 16. The accommodating hole 8c is defined by an inner face 8g that extends in a direction of the predetermined axis. The positioning hole 8d extends in a direction of an axis intersecting the predetermined axis, and communicates with the accommodating hole 8c. Furthermore, the positioning hole 8d has a shape that fits the external shape of the receiving sub-assembly 10, so that the positioning hole 8d can be used to position the receiving sub-assembly 10. The positioning hole 8d is defined by an inner face 8h that extends in a direction of an axis intersecting the predetermined axis. The positioning hole 8d allows the positioning of the receiving sub-assembly 10 with respect to holding member 8.

Furthermore, the holding portion 8a has a sliding face 8i provided at the second end portion of the holding portion 8a. The sliding surface 8i faces the mounting face 6f of the positioning member 6. The sliding face 8i and mounting face 6f are used to position the transmitting sub-assembly 2 and ferrule part 16 in the X and Y directions.

The positioning portion 8b has a guide hole 8j that extends in a direction of the predetermined axis. Furthermore, the positioning portion 8b is defined by side surfaces 8k (the inner face of the guide hole 8j in the present embodiment) that extend in a direction of the predetermined axis. The guide hole 8j extends to the second end portion 8f of the accommodating hole 8c and guides the sleeve 12. The positioning portion 8b of the holding member 8 determines the position of the ferrule part 16 with respect to the Z axis by means of the sleeve 12. In the present embodiment, the side surface 8k extends in a direction of the predetermined axis to the first end portion 8e of the holding portion 8a, but the configuration of the side surface 8k is not limited to this embodiment.

Referring to FIG. 2, a gap is provided between the inner surface 8g of the accommodating hole 8c and the side surface of the ferrule part. The gap allows the movement and rotation of the ferrule part for positioning the optical filter of the ferrule part.

Next, the receiving sub-assembly will be described with reference to FIG. 2. The receiving sub-assembly 10 comprises a mounting member 40, a plurality of lead terminals 42, and a cover member 44 such as a cap. Each of the plurality of lead terminals 42 passes through the mounting member 40 from one surface 40a of the mounting member 40 to the other surface 40b of the mounting member 40. A semiconductor light receiving element 46, such as a photodiode, is provided on the surface 40a. The semiconductor light receiving element 46 is mounted on the surface 40a via a member, such as a sub-mount. The semiconductor light receiving element 46 has a light receiving face. The semiconductor light receiving element is connected via connecting members, such as bonding wires, to internal lead portions 42a that protrude from the surface 40a. The cover member 44 is provided on the mounting member 40 so as to cover the semiconductor light receiving element 46 and internal lead portions 42a. The cover member 44 has a tubular portion 44a extending in a direction of another axis, a flange portion 44b provided on one end of the tubular portion 44a, and a holding portion 44c provided on the other end portion of the tubular portion 44a. The flange portion 44b is provided so that this flange portion 44b faces the surface 40a of the mounting member 40. A lens 50 is held via a adhesive member 52 in a hole provided in the holding portion 44c. Furthermore, the receiving sub-assembly 10 may include a semiconductor integrated circuit element, such as a PIN amplifier (amplifying circuit), and this semiconductor integrated circuit element is connected with the semiconductor light receiving element to receive a photoelectric current therefrom.

The sleeves 12 and 14 will be described with reference to FIGS. 1 and 2. The first sleeve 12 has a first end portion 12a and a second end portion 12b. Furthermore, the first sleeve 12 has a guide portion 12c and a tubular portion 12d which are provided between the first end portion 12a and second end portion 12b in a direction of the predetermined axis.

The guide portion 12c has a guide surface 12e (outside surface in the present embodiment) extending from the first end portion 12a in a direction of the predetermined axis. A projection 12f is provided at the boundary between the guide portion 12c and the tubular portion 12d. The projection 12f is provided with an annular shape on the outside surface of the sleeve 12. The projection 12f acts as a stopper for positioning one end of the positioning portion 8b. The guide portion 12c has a passage hole 12g through which light from the transmitting sub-assembly 2 and light to the receiving sub-assembly are propagated. This passage hole 12g is defined by the inside surface 12h.

The tubular portion 12d has an inside surface 12i that extends from the second end portion 12b in a direction of the predetermined axis. This inside surface 12i defines a passage hole 12j through which light from the transmitting sub-assembly 2 and light to the receiving sub-assembly are propagated. The tubular portion 12d also has a recess 12k that is depressed from the inside surface 12i. This recess 12k is provided so as to surround the predetermined axis, and is provided so that this recess 12k can accommodate the second sleeve 14, such as a split sleeve.

The second sleeve 14 has a first end portion 14a and a second end portion 14b so that the ferrule part 16 can pass therethrough. Furthermore, the second sleeve 14 has side wall 14c, and the side wall 14c extends in a direction of the predetermined axis so as to cover the side surface of the ferrule part 16.

As shown in FIG. 3, the optical communications module 1 can receive an optical coupling device 80 at one end of the sleeve 12 from the direction indicated by Arrow 82.

Figure 4A:
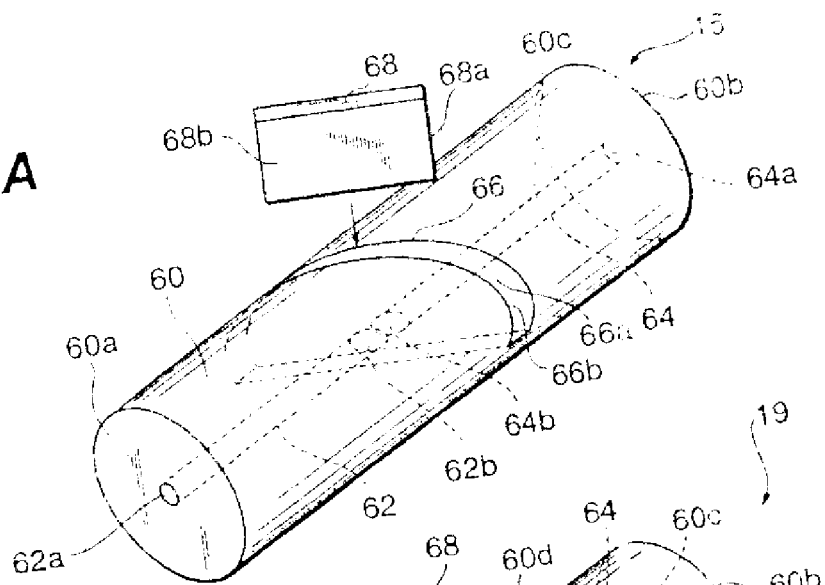
FIG. 4A is a perspective view showing the ferrule part.

FIG. 4A is a perspective view showing the ferrule part. The ferrule part 16 will be described with reference to FIG. 1 and FIG. 4A. The ferrule part 16 has a ferrule 60, optical fibers 62 and 64, a groove 66, and an optical filter 68. The ferrule 60 has first and second end faces 60a and 60b provided to intersect the predetermined axis, and a hole 60c extending from the first end surface 60a to the second end surface 60b. The groove 66 divides the hole 60c into first and second portions. The groove 66 has a pair of side faces 66a and 66b provided so as to determine the orientation of the optical filter 68. The first portion of the hole 60c receives the optical fiber 62. The optical fiber 62 has a first end 62a that appears at the first end surface 60a of the ferrule, and a second end 62b that appears at side end surface 66b of the groove 66. The second portion of the hole 60c receives the optical fiber 64. The optical fiber 64 has a first end 64a that appears at the second end surface 60b of the ferrule, and a second end 64b that appears at the other side surface 66a of the groove 66. The optical filter 68 has a pair of surfaces 68a and 68b, and is provided in the groove 66. The second end portion 62b of the optical fiber 62 faces one face 68b of the optical filter 68. The second end portion 64b of the optical fiber 64 faces the other face 68a of the optical filter 68.

Figure 4B:
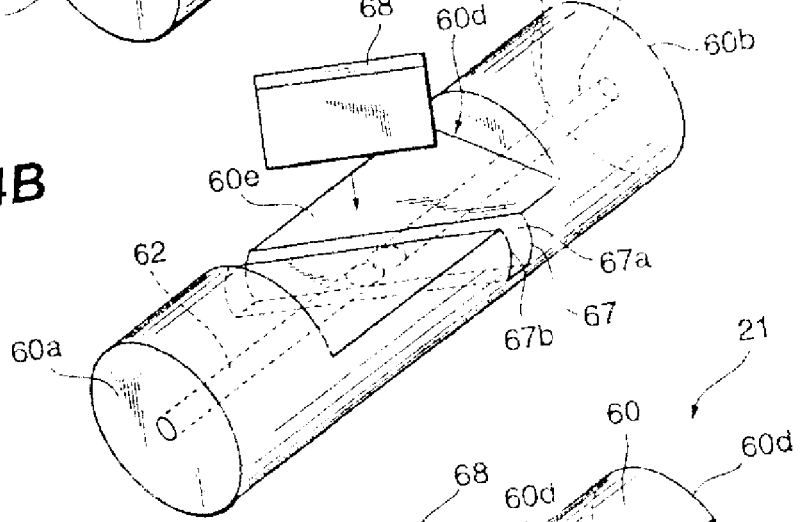
FIGS. 4B and 4C are perspective views showing other embodiments of the ferrule part.
Figure 4C:
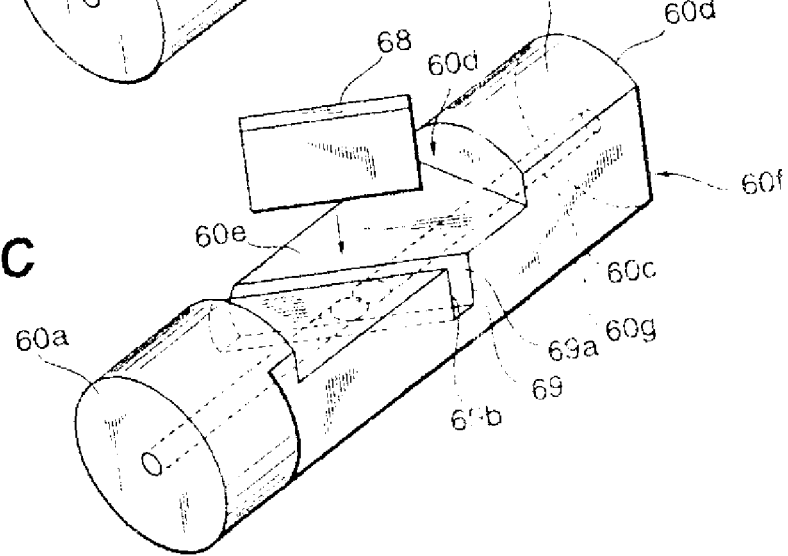

FIGS. 4B and 4C are perspective view showing another embodiments of ferrule parts. Referring to FIG. 4B, a ferrule part 19 is shown. The ferrule part 19 comprises a depression, such as cut-out portion 60d, in an area in which the groove 67 extends across the ferrule 60. The cut-out portion 60d comprises a surface 60e on the side surface of the ferrule 60. The surface 60e has a pair of edges extending in the direction in which the optical fiber insertion hole 60c extends. The groove 67 extends from one edge of the pair of edges to the other. The side surfaces 67a and 67b of the groove 67 are virtually perpendicular to the surface 60e within their production tolerance. The cut-out portion 60d serves to make the depth of the groove 67 shallower.

Figure 5A:
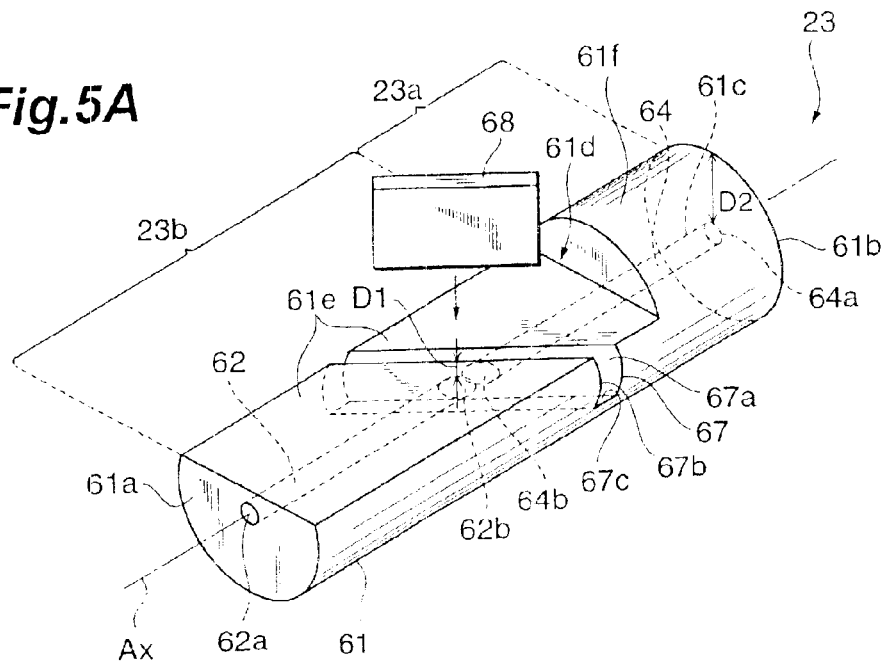
FIG. 5A is a perspective view showing a ferrule part.

FIG. 4C is a perspective view showing still another embodiment of the ferrule part. Referring to FIG. 4C, a ferrule part 21 is shown. The ferrule part 21 further comprises another cut-out portion 60f. The other cut-out portion 60f comprises a surface 60g. The surface 60g extends in a direction through which the ferrule insertion hole 60c extends. The other cut-out portion 60f is provided in the side of the ferrule from which light reflected by the optical filter 68 exits. The other cut-out portion 60f severs to shorten the distance between the optical filter 68 and the receiving sub-assembly. In this embodiment, the surface 60e is virtually perpendicular to the surface 60g as above. FIG. 5A is a perspective view showing a ferrule part. The ferrule part 23 will be described with reference to FIG. 5A. The ferrule part 23 has a ferrule 61, optical fibers 62 and 64, a groove 67, and an optical filter 68. The ferrule 61 has first and second end faces 61a and 61b provided to intersect the axis Ax, and a hole 61c extending from the first end surface 61a to the second end surface 61b. The groove 66 divides the hole 61c into first and second portions. The groove 67 is inclined to the axis Ax. The groove 67 has a pair of side faces 67a and 67b and a bottom face 67c. The side faces 67a and 67b are provided so as to determine the orientation of the optical filter 68. The first portion of the hole 61c receives the optical fiber 62 therein. The optical fiber 62 has a first end 62a that appears at the first end surface 61a of the ferrule 61, and a second end 62b that appears at side end surface 66b of the groove 66. The second portion of the hole 61c receives the optical fiber 64. The optical fiber 64 has a first end 64a that appears at the second end surface 61b of the ferrule, and a second end 64b that appears at the other side surface 67a of the groove 67. The optical filter 68 is provided in the groove 67. The other end 62b of the optical fiber 62 faces the one surface 68b of the optical filter 68. The other end 64b of the optical fiber 64 faces the other surface 68a of the optical filter 68.

The ferrule 61 has first and second portions 23a and 23b arranged in a direction of the axis Ax. The second portion 23b has a depression 61d on the side face 61f of the ferrule. The depression 61d has a face 61e extending in the direction of the axis Ax. The side faces 67a and 67b of the groove 67 is virtually perpendicular to the face 61e within its production tolerance. The face 61e has a pair of edges extending in a direction of the axis Ax. The groove 67 extends from one edge of the pair of edges to the other. Since the ferrule part 23 comprises the groove 68 provided in the depression 61d, the depth of the groove required to divide the hole 61c becomes small. The distance D1 between the face 61e and the first and second optical fibers 62 and 64 in the second portion 23b is smaller than the distance D2 between the side surface 61f and the first and second optical fibers 62 and 64 in the first portion 23a. The groove 67 can be formed by use of a dicing saw machine, for example.

Figure 5B:
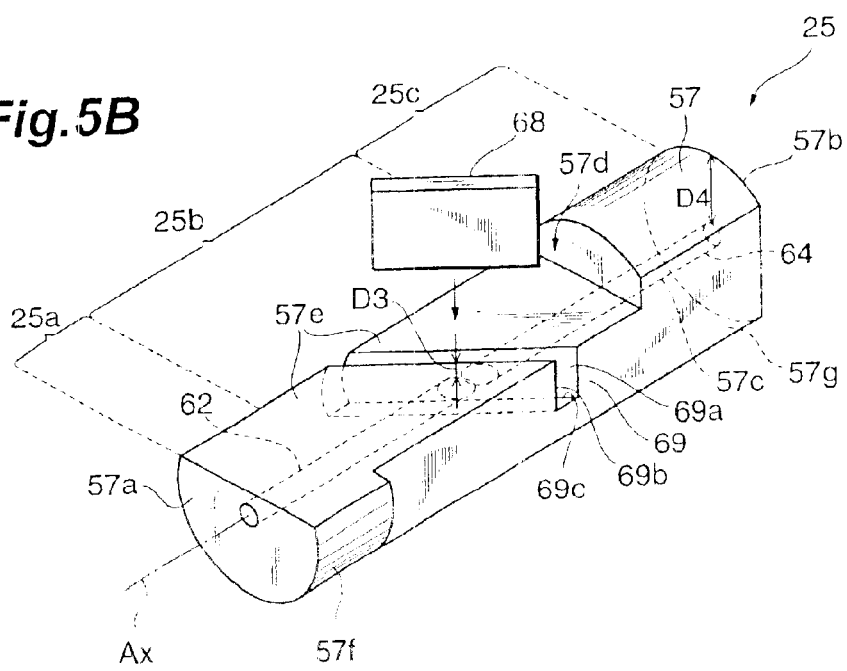
FIG. 5B is a perspective view showing a ferrule part.

FIG. 5B is a perspective view showing a ferrule part. The ferrule part 25 will be described with reference to FIG. 5B. The ferrule part 25 has a ferrule 57, optical fibers 62 and 64, a groove 69, and an optical filter 68. The ferrule 57 has first and second end faces 57a and 57b provided to intersect an axis Ax, and a hole 57c extending from the first end surface 57a to the second end surface 57b. The groove 69 divides the hole 57c into first and second portions. The groove 69 is inclined to the axis Ax. The groove 69 has a pair of side faces 69a and 69b and a bottom face 66c. The side faces 69a and 69b are provided so as to determine the orientation of the optical filter 68. The first portion of the hole 57c receives the optical fiber 62 therein. The second portion of the hole 57c receives the optical fiber 64 therein. The optical filter 68 has a pair of surfaces 68a and 68b, and is provided in the groove 69. The second end portion 62b of the optical fiber 62 faces one face 68b of the optical filter 68. The second end portion 64b of the optical fiber 64 faces the other face 68a of the optical filter 68.

The ferrule 57 has first to third portions 25a, 25b and 25c arranged in the direction of the Axis Ax. In the first and second portions 25a and 25b, a depression 57d is provided on the side face 57f of the ferrule 57. The depression 57d has a face 57e extending in the direction of the axis Ax. The side faces 69a and 69b of the groove 69 is virtually perpendicular to the face 61e within their production tolerance. In the ferrule part 25, since the groove 69 is provided in the depression 57d, the depth of the groove required to divide the hole 57c becomes small. The distance D3 between the face 57e and the first and second optical fibers 62 and 64 in the first and second portions 25a, 25b is smaller than the distance D4 between the side surface 57f and the second optical fiber 64 in the third portion 23c.

Further, the ferrule part 25 comprises another face 57g provided in the second portion 25b of the ferrule 57. The other face 57g extends in a direction of the axis Ax. The other face 57g may be provided in the third portion 25c. The other face 57g is provided in a part of the ferrule side face from which light reflected by the optical filter 68 exits. In the preferred embodiment, the other face 57g may be a planar surface. The other face 57g servers to shorten the distance between the optical filter 68 and the receiving sub-assembly.

Figure 6A:
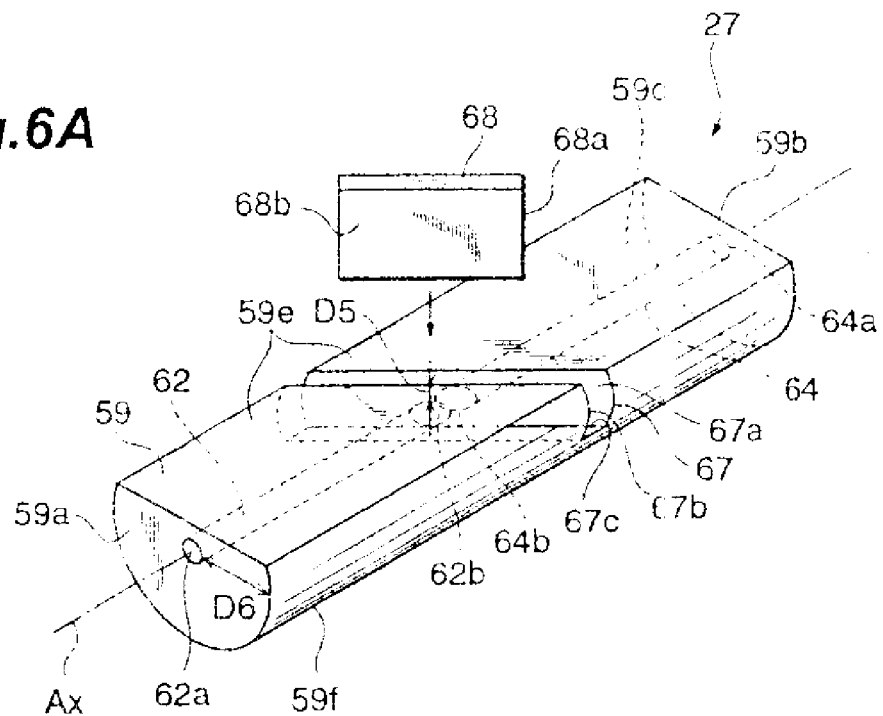
FIG. 6A is a perspective view showing a ferrule part.

In this embodiment, the face 57e is perpendicular to the other surface 57g. The intersection of the other face 57g and one surface of the surfaces 68a and 68b of the groove 68 forms an acute angle, and the intersection of the other face 57g and the other surface of the surfaces 68a and 68b forms a blunt angle. FIG. 6A is a perspective view showing a ferrule part. The ferrule part 27 will be described with reference to FIG. 6A. The ferrule part 27 has a ferrule 59, optical fibers 62 and 64, a groove 67, and an optical filter 68. The ferrule 59 has first and second end faces 59a and 59b provided to intersect the axis Ax, and a hole 59c extending from the first end surface 59a to the second end surface 59b. The groove 67 divides the hole 59c into first and second portions. The groove 67 is inclined to the axis Ax. The first portion of the hole 59c receives the optical fiber 62 therein. The optical fiber 62 has a first end 62a that appears at the first end surface 59a of the ferrule, and a second end 62b that appears at side end surface 67b of the groove 67. The second portion of the hole 59c receives the optical fiber 64 therein. The optical fiber 64 has a first end 64a that appears at the second end surface 59b of the ferrule, and a second end 64b that appears at the other side surface 67a of the groove 67. The optical filter 68 is inserted in the groove 67.

The ferrule 59 has a side face 59f and a face 59e. The side face 59f and face 59e extend from the first face 59a to the second face 59b. The side faces 67a and 67b is virtually perpendicular to the face 59e within their production tolerance. The face 59e has a pair of edges extending in a direction of the axis Ax. The groove 67 extends from one edge of the face 59e to the other edge thereof. Since the ferrule part 27 comprises the face 59e in which the groove 67 extends across the ferrule 59, the depth of the groove 67 is small. The distance D5 between the face 59e and the first and second optical fibers 62 and 64 is smaller than the distance D6 between the side surface 59f and the first and second optical fibers 62 and 64. Therefore, the depth of cut for grooving becomes small.

Figure 6B:
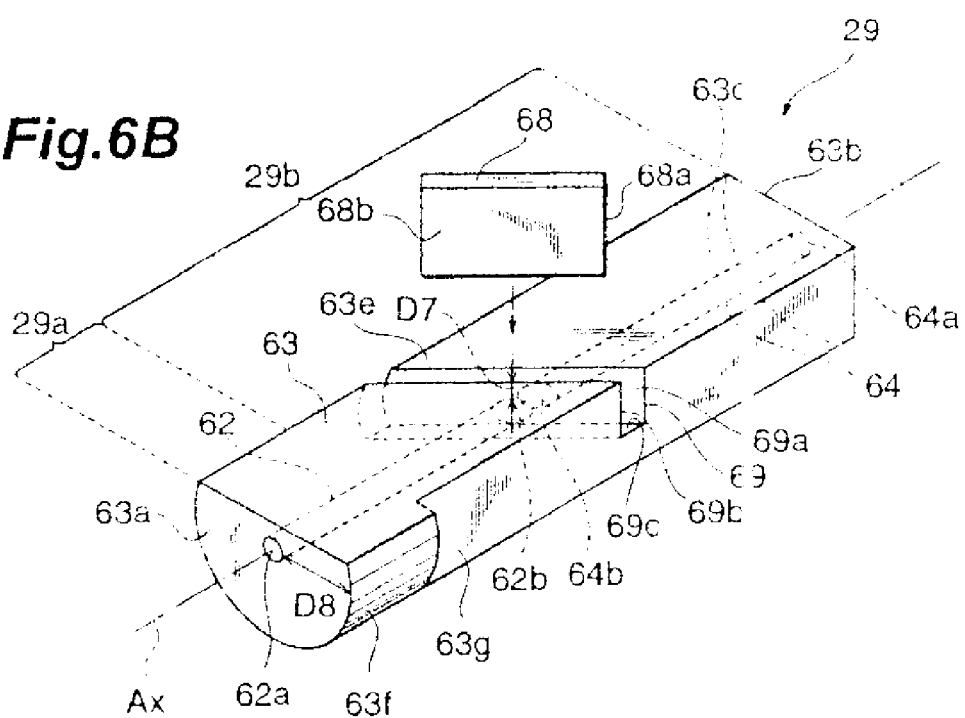
FIG. 6B is a perspective view showing a ferrule part.

FIG. 6B is a perspective view showing a ferrule part. The ferrule part 29 will be described with reference to FIG. 6B. The ferrule part 29 has a ferrule 63, optical fibers 62 and 64, a groove 69, and an optical filter 68. The ferrule 63 has first and second end faces 63a and 63b provided to intersect an axis Ax, and a hole 63c extending from the first end surface 63a to the second end surface 63b. The groove 69 divides the hole 63c into first and second portions. The groove 69 is inclined to the axis Ax. The first portion of the hole 63c receives the optical fiber 62 therein. The second portion of the hole 63c receives the optical fiber 64 therein. The optical filter 68 is provided in the groove 66.

The ferrule 63 has a side face 63f and a face 63e, and the side face 63f and face 63e extend from the first face 63a to the second face 63b. The side faces 67a and 67b is perpendicular to the face 63e within their production tolerance. The distance D7 between the face 63e and the first and second optical fibers 62 and 64 is smaller than the distance D8 between the side surface 63f and the first and second optical fibers 62 and 64. Since the ferrule part 29 comprises the face 63e in which the groove 67 extends across the ferrule 63, the depth of the groove 67 is small. Further, the ferrule 63 has first and second portions 29a and 29b. The ferrule part 29 further comprises another face 63g provided in the second portion 29b. The other face 63g extend in a direction in which the ferrule insertion hole 63c extends. The other face 63g is provided in a portion of the ferrule side face from which light reflected by the optical filter 68 exits.

Figure 7A:
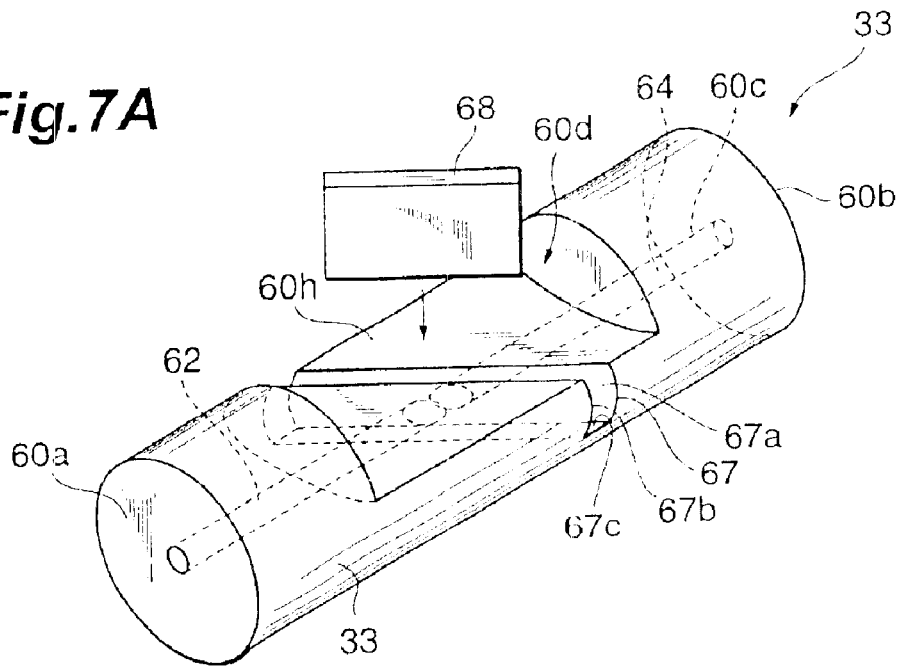
FIG. 7A is a perspective view showing a ferrule part.
Figure 7B:
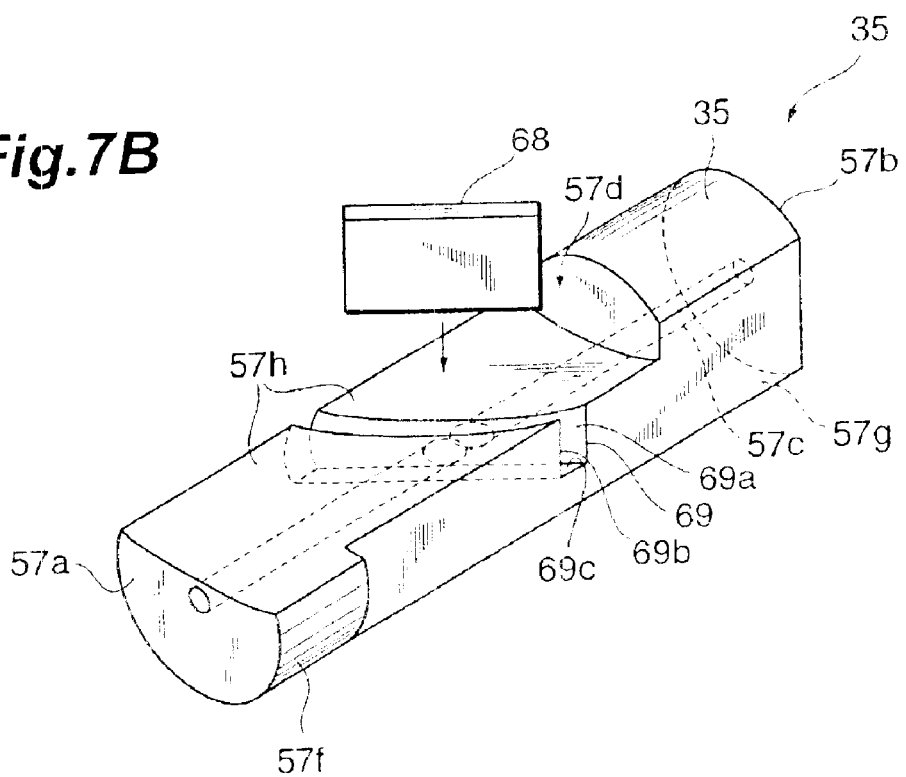
FIG. 7B is a perspective view showing a ferrule part.

FIG. 7A is a perspective view showing a ferrule part. The ferrule part 33 will be described with reference to FIG. 7A. The ferrule part 33 has a face 60h in place of the face 66e of the ferrule part 19. FIG. 7B is a perspective view showing a ferrule part. The ferrule part 35 will be described with reference to FIG. 7B. The ferrule part 35 has a face 57h in place of the face 57e of the ferrule part 31. As shown in FIGS. 4A to 7B, the groove for the optical filter may be provided in a planar or curved surface formed in a portion of the ferrule side surface.

The ferrule is made of a material that can transmit light of the wavelength received by the receiving sub-assembly; an optical glass may be cited as an example of this material. The above ferrule parts are preferred embodiments in their shapes, for example, and thus the configurations of the present invention should not be limited thereto. WDM filters may be used as the optical part.

Figure 8A:
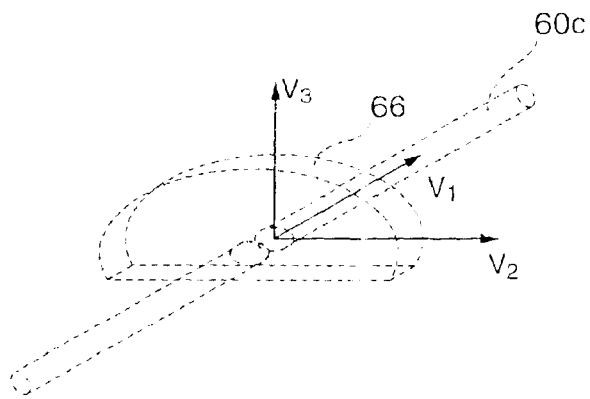
FIGS. 8A and 8B are views showing the positional relationship between the optical fiber and the groove provided in the ferrule.
Figure 8B:
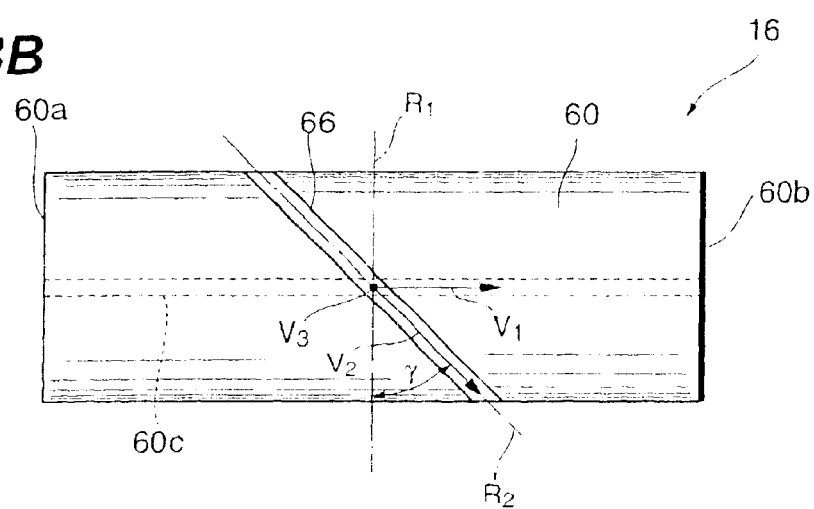
Figure 8C:
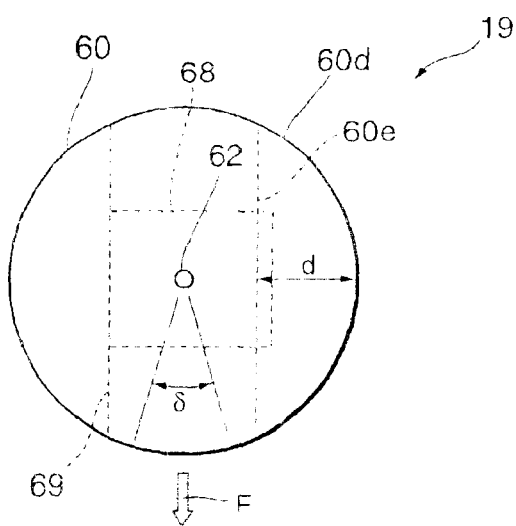
FIG. 8C is a side view showing the ferrule part.

FIGS. 8A and 8B are views showing the positional relationship of the optical fibers and the groove provided in the ferrule. FIG. 8C is a view showing the optical fiber insertion hole 60c and groove 66 provided in the ferrule part 16. The optical fiber insertion hole 60c extends in the direction indicated by Vector $V_1$. The groove 66 extends across the ferrule 60 in the direction indicated by Vector $V_2$. Vector $V_3$ is generated by the outer product of the vector $V_1$ and vector $V_2$. Accordingly, the vector $V_3$ ($=V_1 \times V_2$) is perpendicular to the vector $V_1$, and the vector $V_3$ is perpendicular to the vector $V_2$. The groove 66 extends along a plane defined by the vector $V_3$ and vector $V_2$.

FIG. 8B is a plan view showing the optical fiber insertion hole 60c and groove 66 provided in the ferrule part 16. The reference plane $R_1$ is perpendicular to the optical fiber insertion hole 60c. The reference plane $R_2$ is generated by rotating the reference plane $R_1$ by an angle γ about an axis extending along the vector $V_3$. The groove 66 extends across the ferrule 60 along the reference plane $R_2$. The angle γ is an acute angle.

FIG. 8C is a side view showing the ferrule part. In the ferrule part 19, light reflected by the optical filter 68 is emitted mainly in an angular range indicated by an angle δ and in a direction indicated by Arrow F. It is desirable that the depth d of the cut-out portion 60d be determined so that the light reflected by the optical filter does not pass through a part of the surface 60e.

Figure 9A:
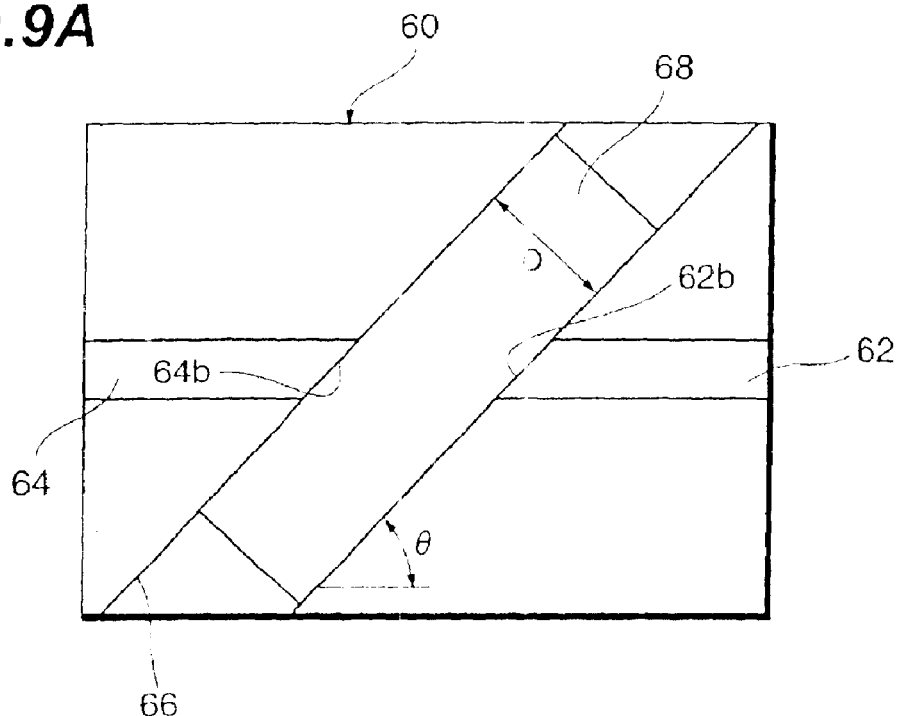
FIG. 9A is a view showing a model used in numerical experiments.
Figure 9B:
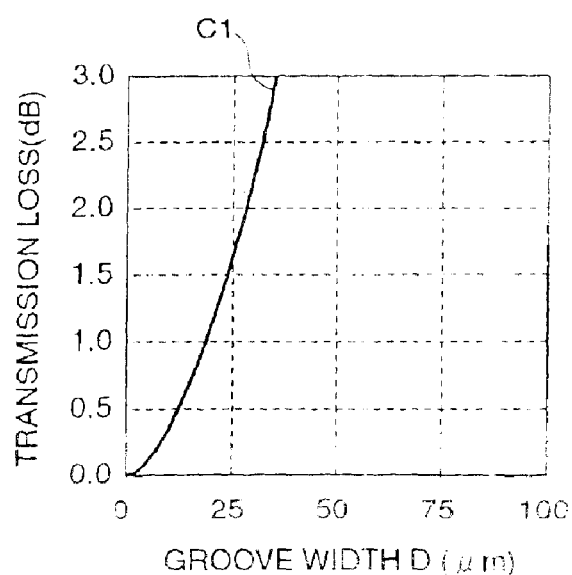
FIG. 9B is a view showing the results of the numerical experiments.

The optical characteristics of the ferrule part including the optical filter in the groove of the ferrule will be described with reference to FIGS. 9A and 9B. FIG. 9A shows a model for numerical experiments. In the ferrule, the groove has a width of D, and is inclined by an angle of θ with respect to an axis of the optical fiber. FIG. 9B shows the results of the numerical experiments. In these experiments, the following values are used: wavelength λ=1.31 micrometers, refractive index n of the core of the optical fiber=1.45 and angle θ=π/4 radians. An optical filter can be manufactured and provided in a groove with a width D of 50 micrometers. If an optical filter with a width of approximately 50 micrometers is secured to the groove using adhesive agent (the refractive index of the adhesive agent: n=1.45), the transmission loss can be equal to or less than 1 dB. For example, a quartz substrate having a thickness of approximately 50 micrometers may be cited as an example of this optical filter, and the quartz substrate is polished to a thickness of approximately 50 micrometers. As indicated by the curve C1 in FIG. 9B, if a polyimide film with a refractive index of approximately 1.65 and a thickness of approximately 25 micrometers can realize transmission loss of 2 dB or less. The refractive index of material for the optical filter may be in the range of n=1.45 to 1.65. It should be noted that the transmission loss of the optical filter does not have nothing to do with the optical coupling efficiency between the transmitting sub-assembly and the optical fiber. This coupling efficiency is determined by the optical positioning of the transmitting sub-assembly and ferrule part in the optical communications module of the present embodiment, and is substantially unrelated to the disposition of the optical filter.

The optical positioning in the optical communications module of the present embodiment will be described with reference to FIGS. 10A to 10C and FIGS. 11A and 11B.

As is shown in FIG. 10A, the ferrule part 16 and the sleeves 12 and 14 is assembled to form a part A. As shown in FIG. 10B, the receiving sub-assembly 10 and the holding member 8 is assembled to form a part B. The receiving sub-assembly 10 is welded to the holding member 8 at welded portions W1.

As shown in FIG. 10C, the above-mentioned parts A and B are assembled together so that the optical filter 68 of the ferrule part 16 is optically aligned with the light receiving element 46 provided in the receiving sub-assembly 10. This assembly can be performed by the following procedure. First, the parts A and B are prepared. One part of these parts A and B is moved in a direction of the Z axis toward the other of the parts A and B, and then the one part is inserted into the other part so that the side surfaces 8k of the holding member 8 face the guide surfaces 12e of the guide member 12. Next, light from the light source 70 is supplied to the optical fiber 62, and the photoelectric current from the receiving sub-assembly 10 is measured by use of a measuring instrument 72. Thereafter, one of the two parts, i.e. either the ferrule part A or the holding portion B, is rotated about a predetermined axis extending in the Z axis and is moved in the direction of the Z axis with respect to the other of the two parts, so that these parts are positioned to each other at a position where the receiving sub-assembly 10 generates the desired photoelectric current value (maximum value). After this positioning has been determined, the parts A and B are welded at welded portions W2 to form a part C assembled from the parts A and B.

As shown in FIG. 11A, the transmitting sub-assembly 2 is assembled with the guide member 4 to form a part D. The bonding face 4b of the guide member 4 is welded to the mounting member 20 of the transmitting sub-assembly 2 to form portions W3.

Next, as shown in FIG. 11B, the part C, part D and positioning member 6 are arranged along the Z axis. One part of the part D and the positioning member 6 is inserted into the other of these two parts in the direction of the Z axis, so that the side faces 4e of the guide member 4 faces the side faces 6e of the positioning member 6. Furthermore, the part C is placed on the positioning member 6 so that the sliding face 8i of the part C faces the mounting face 6f of the positioning member 6. An electric current from the power supply 74 is supplied to the semiconductor light generating element 26 so that the semiconductor light generating element 26 generates light. The amount of light from the semiconductor light generating element 26 is measured by use of the measuring device 76 while moving either the part D or the positioning member 6 with respect to the other of these two parts in the direction of the Z axis and while moving either the part C or the positioning member 6 with respect to the other of these two parts in the directions of the X axis and Y axis. Then, the parts C and D and the positioning member 6 are moved to determine their arrangement in which the desired amount of light is obtained from the semiconductor light generating element 26. After the arrangement has been determined, the part C and positioning member 6 are welded at welded portions W4, and the part D and positioning ember 6 are welded at welded portions W5.

After the abovementioned manufacturing process, the optical alignment is has been achieved in the optical communications module 1.

Figure 12A:
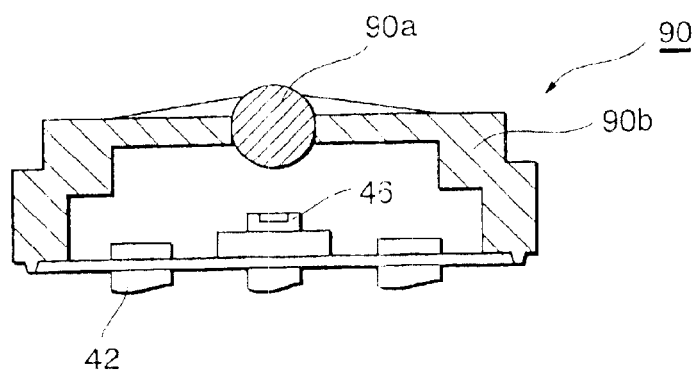
FIGS. 12A to 12D are sectional views showing receiving sub-assemblies that can be used in the optical communications module of the present embodiment.
Figure 12B:
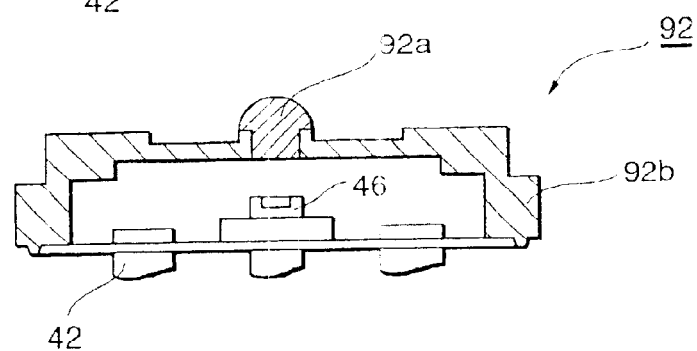

FIGS. 12A to 12D are sectional views showing modifications of receiving sub-assemblies that can be used in the optical communications module according to the present embodiment. FIG. 12A shows one modification of a receiving sub-assembly 90 that includes a spherical lens 90a and a lens cap 90b. FIG. 12B shows another modification of a receiving sub-assembly 92 that includes a hemispherical lens 92a and a lens cap 92b.

Figure 13A:
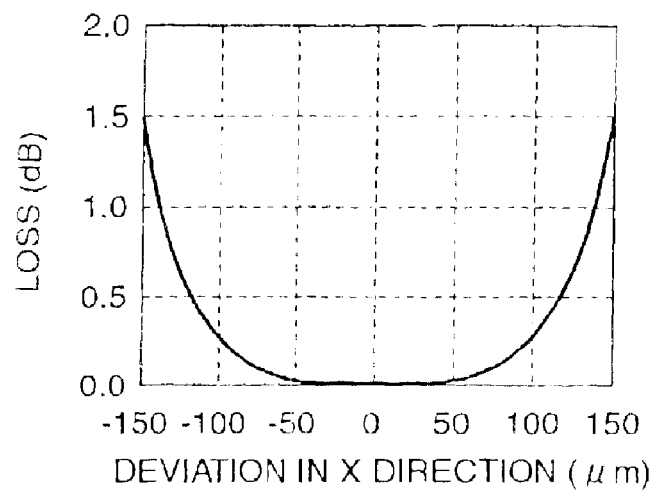
FIG. 13A is a view showing the results of numerical experiments on the optical coupling in the direction of the X axis.
Figure 13B:
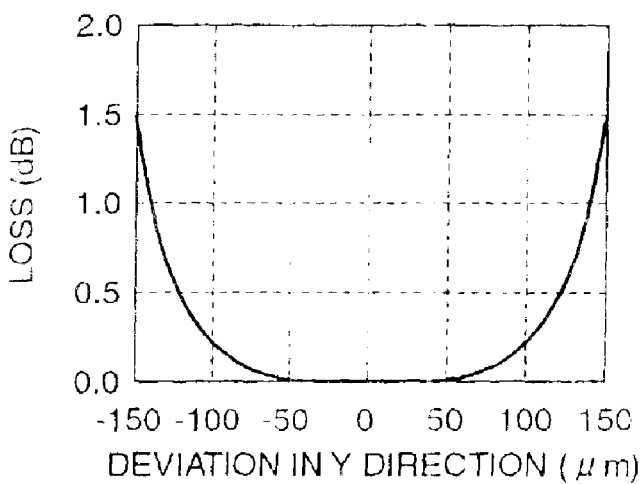
FIG. 13B is a view showing the results of numerical experiments on the optical coupling in the direction of the Y axis.
Figure 13C:
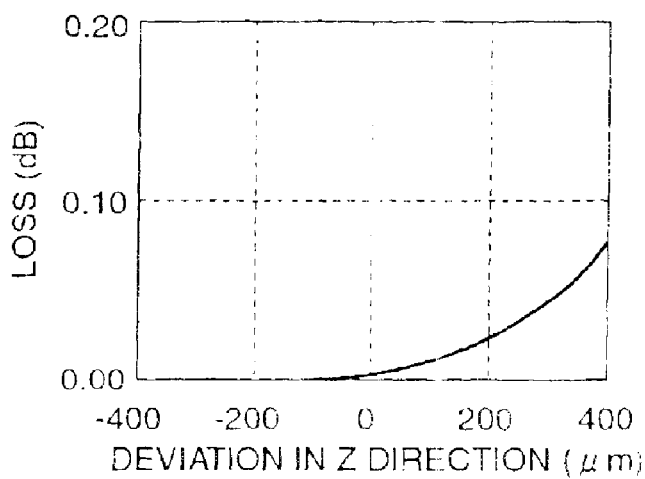
FIG. 13C is a view showing the results of numerical experiments on the optical coupling in the direction of the Z axis.
Figure 14A:
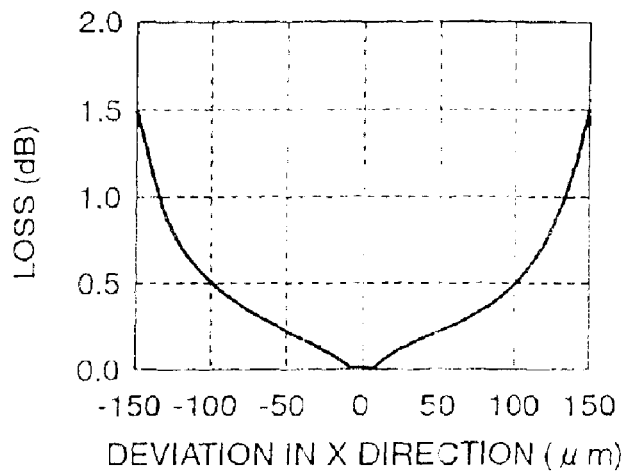
FIG. 14A is a view showing the results of numerical experiments on the optical coupling in the direction of the X axis.
Figure 14B:
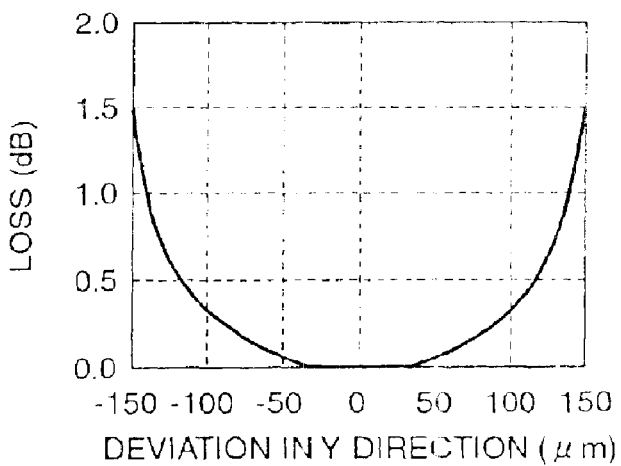
FIG. 14B is a view showing the results of numerical experiments on the optical coupling in the direction of the Y axis.
Figure 14C:
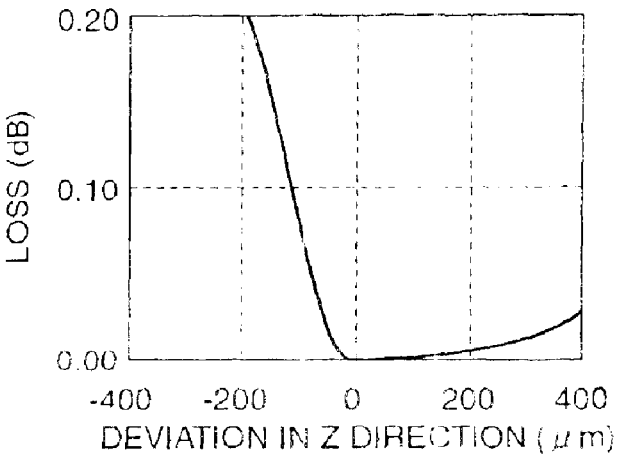
FIG. 14C is a view showing the results of numerical experiments on the optical coupling in the direction of the Z axis.

FIGS. 13A to 13C are views showing the tolerance of the optical coupling between the optical filter and the receiving sub-assembly having a spherical lens as shown in FIG. 12A. FIG. 13A shows the results of numerical experiments on the optical coupling in the direction of the X axis, FIG. 13B shows the results of numerical experiments on the optical coupling in the direction of the Y axis, and FIG. 13C shows the results of numerical experiments on the optical coupling in the direction of the Z axis. FIGS. 14A to 14C are views showing the results of numerical experiments on the optical coupling between the optical filter and the receiving sub-assembly having a hemispherical lens 92a as shown in FIG. 12B. FIG. 14A shows the results of numerical experiments on the optical coupling in the direction of the X axis, FIG. 14B shows the results of numerical experiments on the optical coupling in the direction of the Y axis, and FIG. 14C shows the results of numerical experiments on the optical coupling in the direction of the Z axis. In all of the configurations, the coupling tolerance at a coupling loss of 1.0 dB or less is 100 micrometers or greater.

Figure 12C:
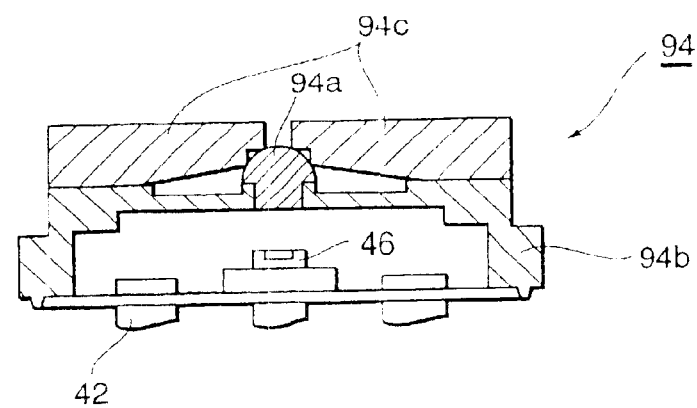

FIG. 12C shows still another modification of a receiving sub-assembly 94 having a hemispherical lens 94a and a lens cap 94b. The receiving sub-assembly 94 comprises the structure of an aperture diaphragm 94c, mounted on the lens cap 94b, having an opening in the central portion. The diaphragm structure 94c prevents undesired light from entering the light receiving element 46, and allows light from the optical filter to enter the light receiving element 46.

Furthermore, the hemispherical lens having an aperture diameter of 0.4 millimeters or less can reduce the optical crosstalk. Moreover, a window for light incident on the receiving sub-assembly can be restricted by an aperture provided between the optical filter and the receiving sub-assembly. For example, if the aperture diameter of a lens of 0.7 millimeters is changed to 0.4 millimeters, optical crosstalk can be reduced by approximately 60 percent.

Figure 12D:
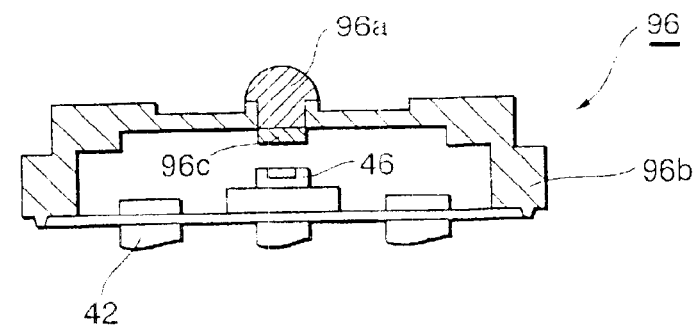

FIG. 12D shows further modification of a receiving sub-assembly 96 including a hemispherical lens 96a and a lens cap 96b. In the receiving sub-assembly 96, the hemispherical lens 96a has a spherical surface portion that faces the ferrule part, and a planar portion that faces the light receiving element. An optical filter may be provided on this planar portion to block light from the transmitting sub-assembly and to transmit light to the receiving sub-assembly. The optical filter 96c can be obtained by vacuum-evaporating a film on the planar portion. In an optical filter 96c of this type, the filtering characteristics with respect to light of a predetermined wavelength are more superior as the flatness of the underlying surface is better. The optical filter 96c can reduce the optical crosstalk. The optical filter may also be provided with a flat window.

Figure 15:
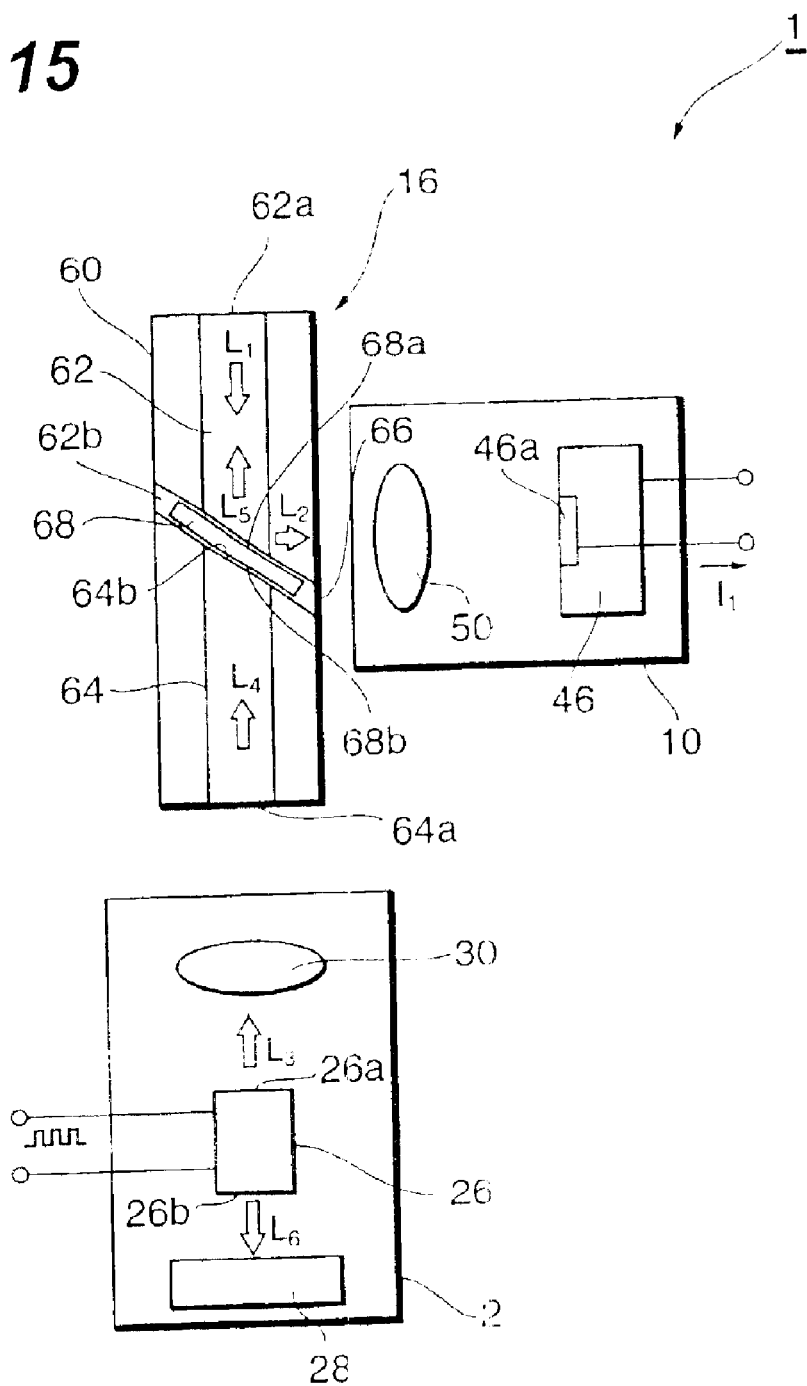
FIG. 15 is a model diagram showing an optical arrangement in the optical communications module of the embodiment.

FIG. 15 is a view showing the arrangement of the optical components in the optical communications module of the present embodiment. This optical communications module 1 comprises a transmitting sub-assembly 2, a receiving sub-assembly 10, and a ferrule part 16. This optical communications module 1 receives light in the 1.55 micrometer wavelength band (wavelength $\lambda_1$), and emits light in the 1.3 micrometer wavelength band (wavelength $\lambda_2$). The transmitting sub-assembly 2 is optically coupled with the end portion 64a of the optical fiber 64 that appears at one end of the ferrule part 16. The receiving sub-assembly 10 is optically coupled to the light reflecting surface 68a of the optical filter 68 via the body the ferrule 60.

The optical communications module 1 receives light $L_1$ with a wavelength of $\lambda_1$ from one end (first end) 62a of the optical fiber 62. The reflective surface 68a of the optical filter 68 reflects the light $L_1$ to form light $L_2$. The light $L_2$ passes through the optical lens 50 of the receiving sub-assembly 10, and is converted into a photoelectric current $I_1$ in the light receiving region 46a of the semiconductor light receiving element 46.

The semiconductor light generating element 26 emits light $L_3$ having a wavelength of $\lambda_2$ from one end surface 26a thereof, and emits light $L_6$ having a wavelength of $\lambda_2$ from the other end surface 26b. The light $L_3$ enters the optical fiber 64 via the lens 30 and one end (first end) 64a of the optical fiber 64 to become light $L_4$. The light $L_4$ passes through the other end (second end) 64b of the optical fiber 64, the reflection face 68a and transmission face 68b of the optical filter 68 and one end 62b (second end) of the optical fiber 62 to become light $L_5$. The light $L_5$ exits from the other end 62a of the optical fiber 62. The light $L_6$ reaches a monitoring light receiving element 28.

Figure 29:
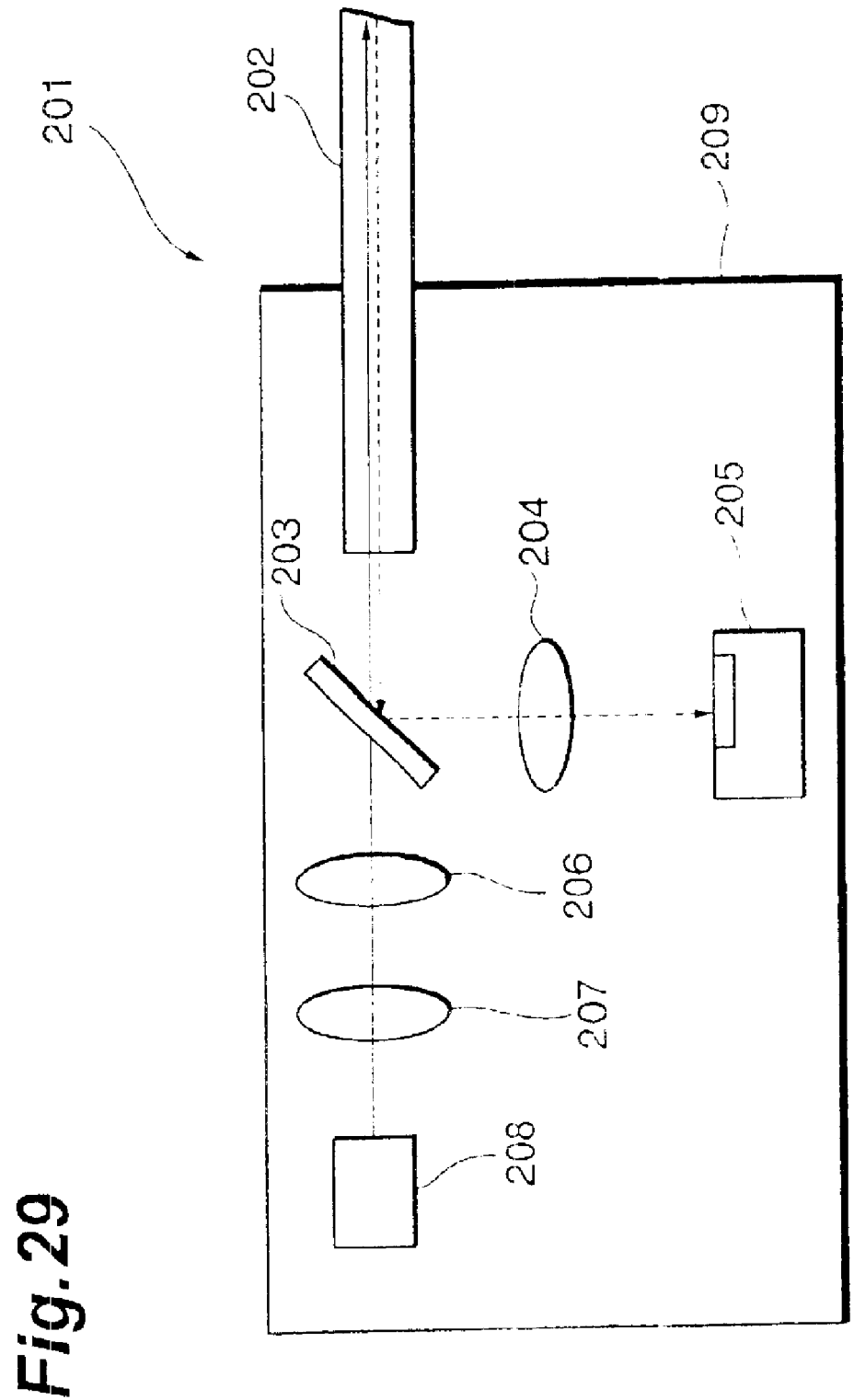
FIG. 29 is a diagram showing the structure of a bi-directional optical communications module used by the present inventors for technical studies.

The optical communications module 1 of the present embodiment makes it possible to obtain good optical coupling between the ferrule part 16 and the transmitting sub-assembly 2 by means of a single lens. However, the optical communications module as shown in FIG. 29 requires two lenses in order to obtain optical coupling between the optical filter and the transmitting sub-assembly. The reason is as follows: if a single lens were used in the optical communications module as shown in FIG. 29, light from the transmitting sub-assembly could be directly incident on the transmitting surface of the optical filter via the single lens; in the optical communications module of the single lens type, the transmitting surface of the optical filter reflects most of the light from the transmitting sub-assembly, so that only the small amount of light reaches the optical fiber in the alignment of the transmitting sub-assembly and optical fiber in the manufacturing steps. Accordingly, much time is required for their assembly.

Furthermore, in the optical communications module as shown in FIG. 29, the semiconductor laser element 208 inside the transmitting sub-assembly, the photodiode 205 inside the receiving sub-assembly and the optical filter 203 must be optically aligned together to each other. This alignment requires a considerable amount of time for assembling the optical communications module as shown in FIG. 29. The optical coupling efficiency between the optical fiber and transmitting sub-assembly is not large because of the large distance between the optical fiber and the transmitting sub-assembly. Accordingly, much time is required for the alignment. In order to improve this coupling efficiency, it is necessary to need additional parts to the optical communications module. However, the addition of new parts conflicts with the strategy of making the optical communications module more compact.

In the optical communications module 1 of the present embodiment, on the other hand, this module has a structure which makes it possible to reduce the distance between the optical fiber and the transmitting sub-assembly. This structure makes it possible to increase the optical coupling efficiency between the optical fiber and the transmitting sub-assembly.

Figure 16:
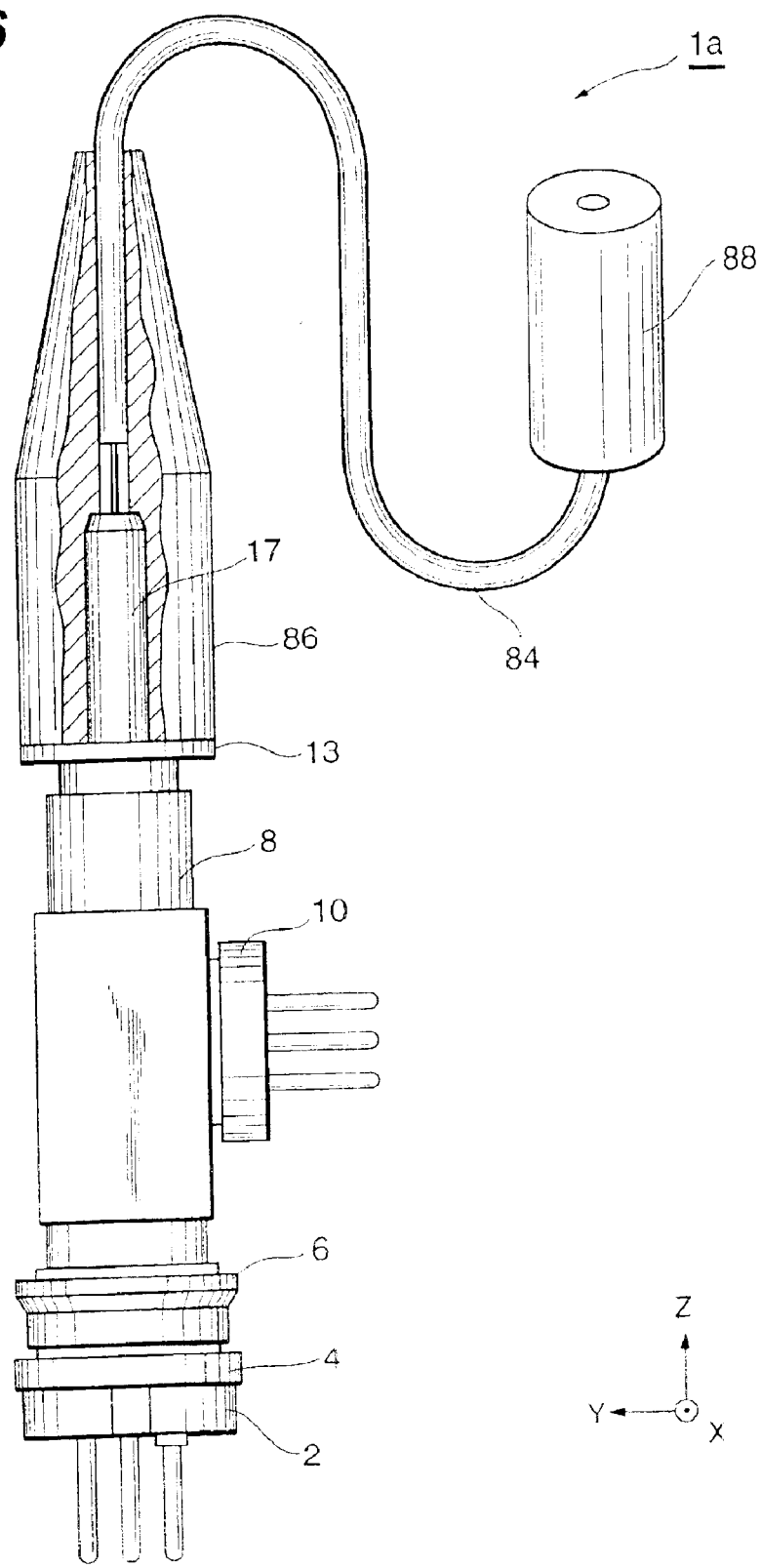
FIG. 16 is a side view showing a modification of the optical communications module according to the embodiment.

FIG. 16 is a side view showing a modification of optical communications modules according to the first embodiment. This optical communications module 1a comprises a ferrule part 17 instead of the ferrule part 16. The ferrule part 17 is held inside a sleeve 13 supported on the supporting member 8. The ferrule part 17 comprises a pigtail optical fiber 84. An optical connector device 88, such as a ferrule, is provided on the other end of the pigtail optical fiber 84. A protective member 86, such as a rubber cap, covers the end portion of the optical communications module 1a.

FIGS. 17 through 22 are sectional views showing a number of modifications of the optical communications module 1 of the first embodiment.

Figure 17:
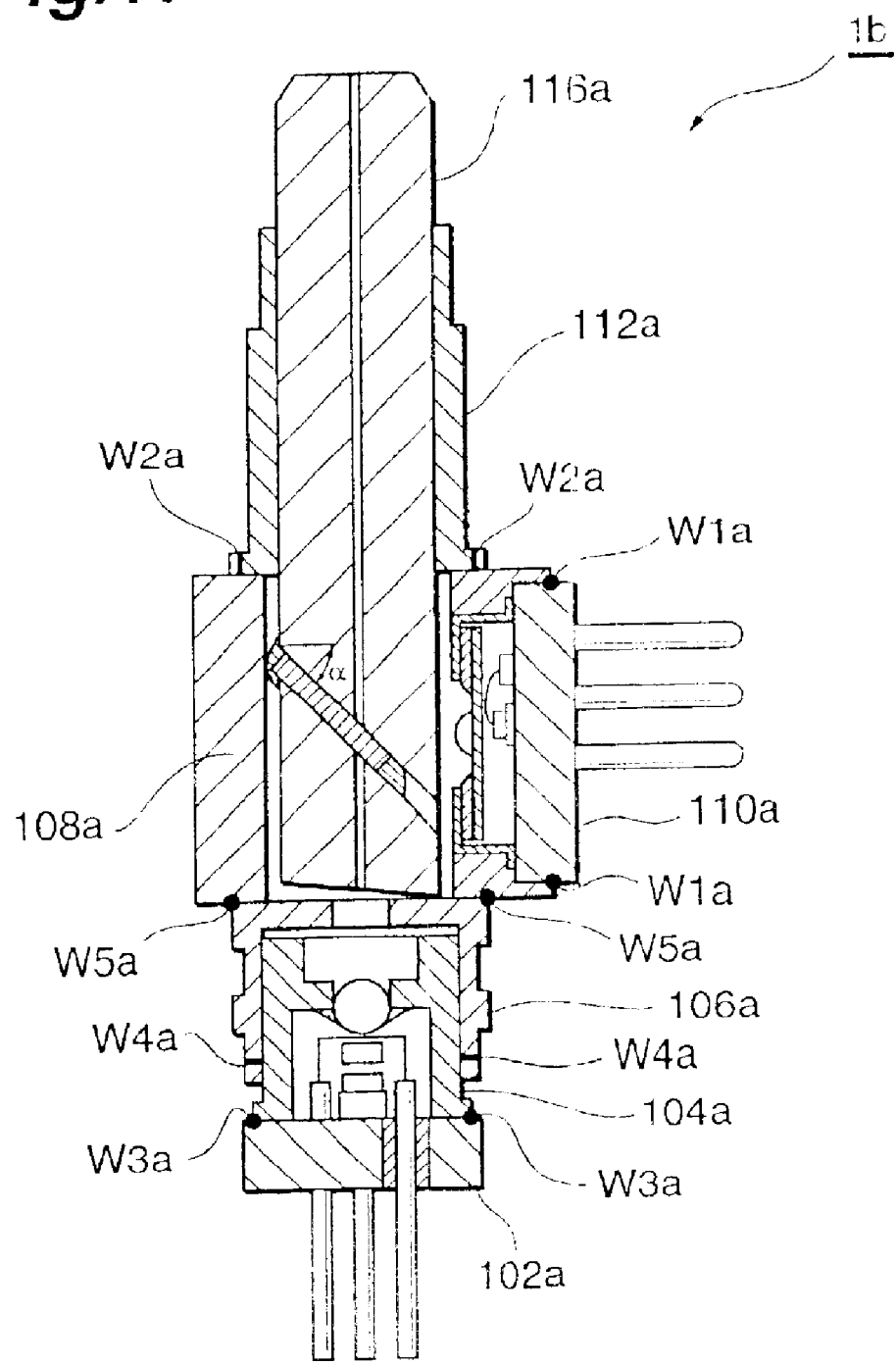
FIG. 17 is a side view showing a modification of the optical communications module according to the embodiment.

Referring to FIG. 17, the optical communications module 1b comprises a transmitting sub-assembly 102a, a guide member 104a, a positioning member 106a, a holding member 108a, a receiving sub-assembly 110a, a sleeve 112a and a ferrule part 116a. Unlike the optical communications module 1a, the optical communications module 1b does not have a cover member (reference number 24 in FIG. 1). In the optical communications module 1b, the guide member 104a holds a lens and acts as a cover member. The angle $\alpha$ of inclination of the optical filter is $\pi/4$ radians. The ferrule part 116a comprises a ferrule with a diameter of 2.5 millimeters. The receiving sub-assembly 110a is secured to the holding member 108a by welded portions W1a. The holding member 108a is secured to the sleeve 112a by a welded part W2a. The transmitting sub-assembly 102a is secured to the guide member 104a by welded portions W3a. The guide member 104a is secured to the positioning member 106a by welded portions W4a. The positioning member 106a is secured to the holding member 108a by welded portions W5a.

Figure 18:
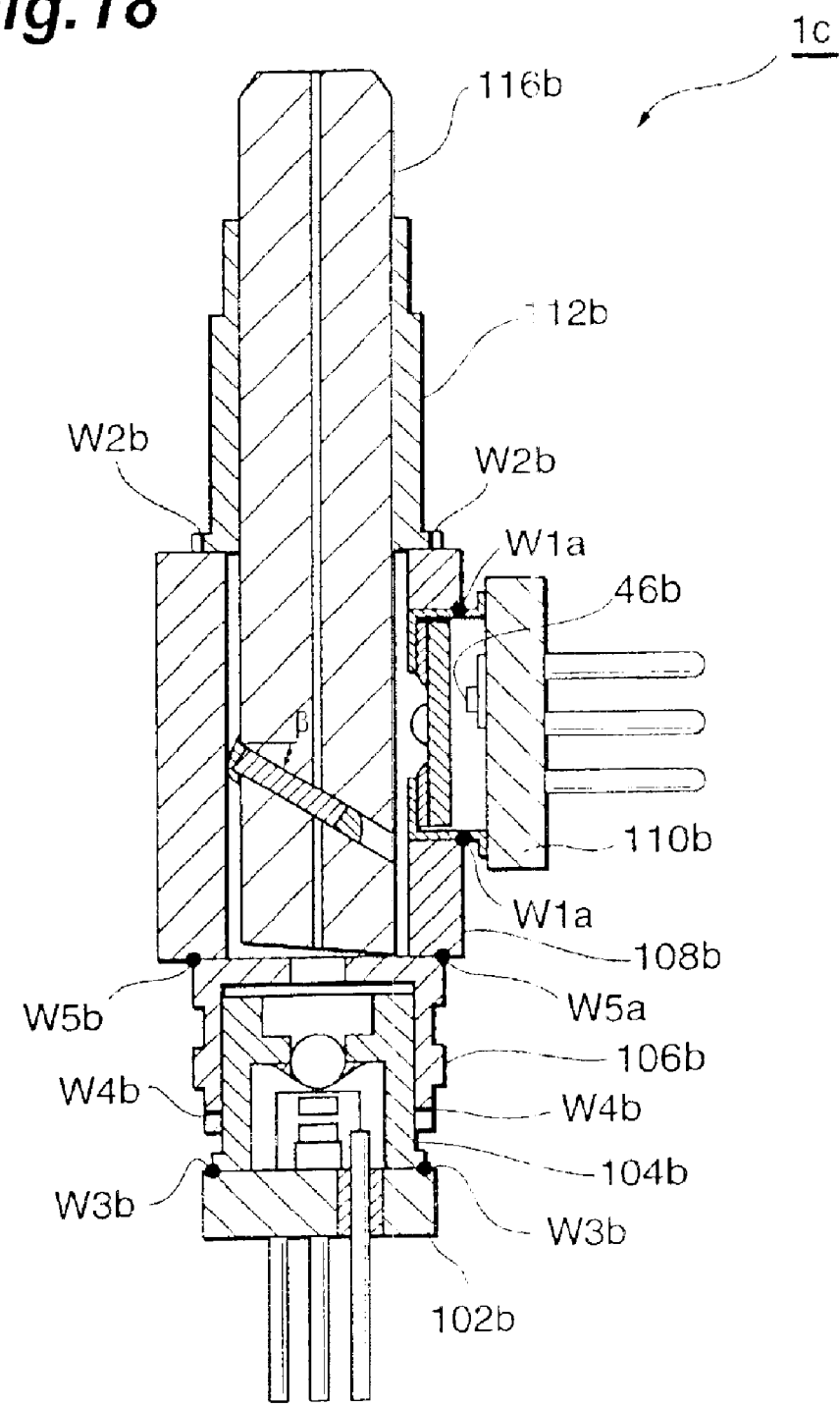
FIG. 18 is a side view showing a modification of the optical communications module according to the embodiment.

Referring to FIG. 18, the optical communications module 1c comprises a transmitting sub-assembly 102b, a guide member 104b, a positioning member 106b, a holding member 108b, a receiving sub-assembly 110b, a sleeve 112b and a ferrule part 116b. Unlike the optical communications module 1a, the optical communications module 1c does not have a cover member (reference number 24 in FIG. 1). In the optical communications module 1c, the guide member 104b holds a lens and acts as a cover member. The ferrule part 116a comprises a ferrule with a diameter of 2.5 millimeters. The angle $\alpha$ of inclination of the optical filter is $\pi/6$ radians. In accordance with this angle, there is an offset in the position of the light receiving element 46b in the receiving sub-assembly 110b. Since a WDM filter exhibits better filtering characteristics as the angle of incidence of light decreases, the optical crosstalk can be ameliorated. In the optical communications module 1c, the transmitting sub-assembly 102b, guide member 104b, positioning member 106b, holding member 108b, receiving sub-assembly 110b and sleeve 112b are secured at the respective welded portions W1b through W5b.

Figure 19:
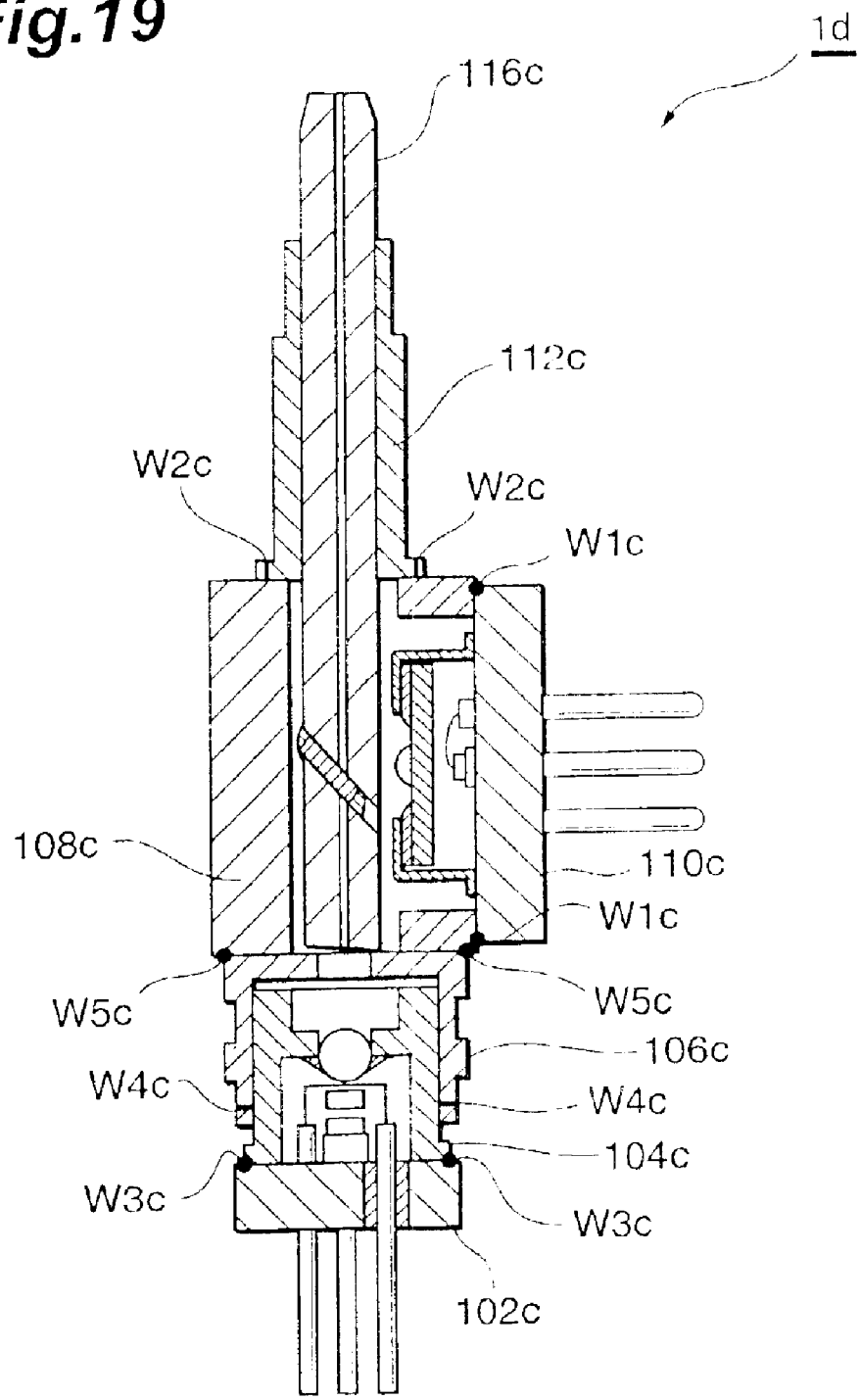
FIG. 19 is a side view showing a modification of the optical communications module according to the embodiment.

Referring to FIG. 19, the optical communications module 1d comprises a transmitting sub-assembly 102c, a guide member 104c, a positioning member 106c, a holding member 108c, a receiving sub-assembly 110c, a sleeve 112c and a ferrule part 116c. Unlike the optical communications module 1a, the optical communications module 1d does not have a cover member (reference number 24 in FIG. 1). In the optical communications module 1d, the guide member 104c holds a lens and acts as a cover member. Since the ferrule part 116a comprises an LC type ferrule with a diameter of 1.25 millimeters, the size of the optical communications module 1d can be reduced to a depth of 5.0 millimeters, a width of 4.7 millimeters and a length of 19.5 millimeters. The angle $\alpha$ of inclination of the optical filter is approximately π/4 radians. The receiving sub-assembly has a flat window structure; accordingly, no lens is installed therein. Consequently, the structure of the receiving sub-assembly can be simplified. In the optical communications module 1d, the transmitting sub-assembly 102c, guide member 104c, positioning member 106c, holding member 108c, receiving sub-assembly 110c and sleeve 112c are secured by the respective welded portions W1c through W5c.

Figure 20:
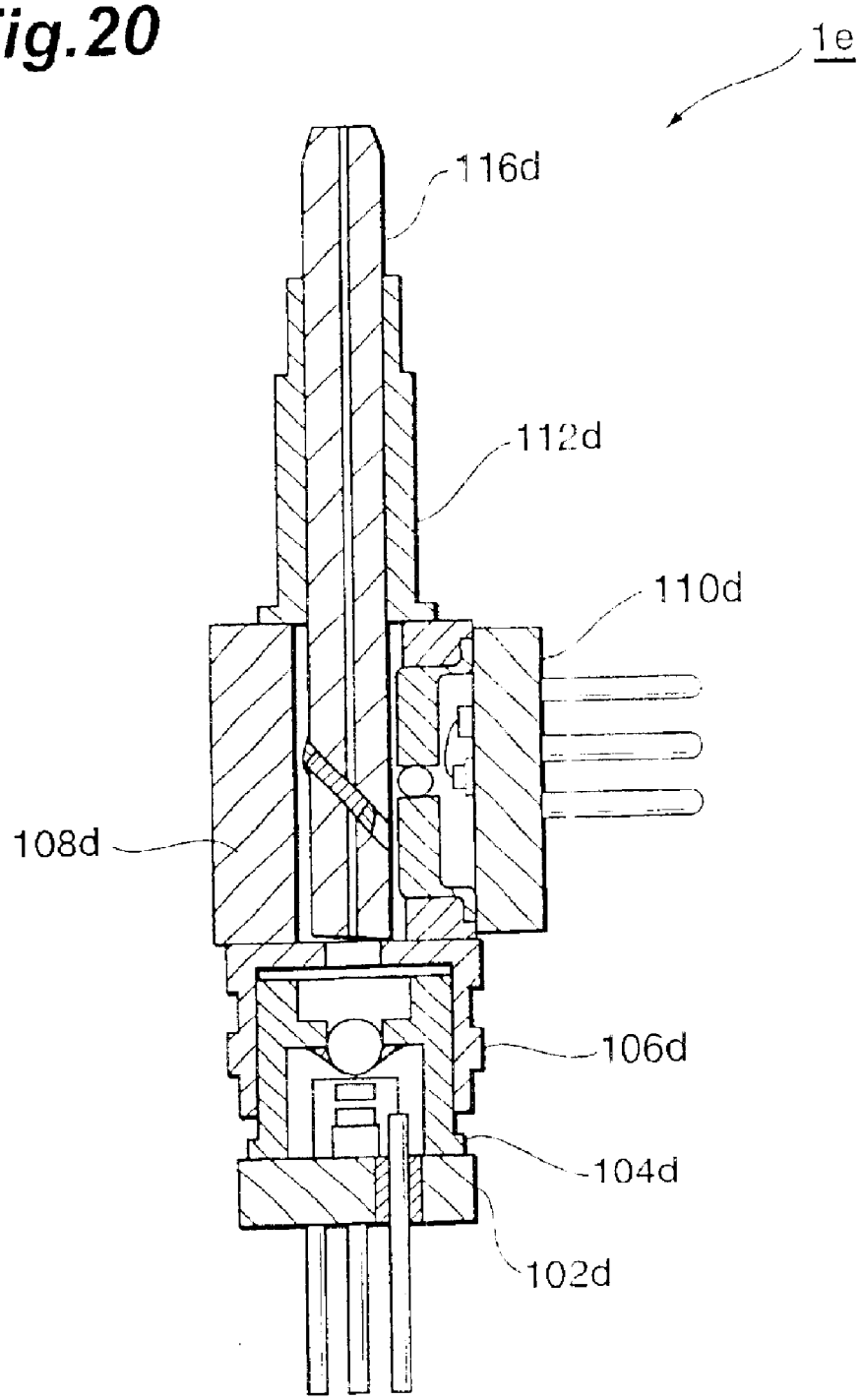
FIG. 20 is a side view showing a modification of the optical communications module according to the embodiment.

Referring to FIG. 20, the optical communications module 1e comprises a transmitting sub-assembly 102d, a guide member 104d, a positioning member 106d, a holding member 108d, a receiving sub-assembly 110d, a sleeve 112d and a ferrule part 116d. Unlike the optical communications module 1a, the optical communications module 1e does not have a cover member (reference number 24 in FIG. 1). In the optical communications module 1e, the guide member 104d holds a lens and acts as a cover member. The ferrule part 116d comprises an LC type ferrule with a diameter of 1.25 millimeters, so that the size of the optical communications module 1d can be made compact. The angle α of inclination of the optical filter is approximately π/4 radians.

Figure 21:
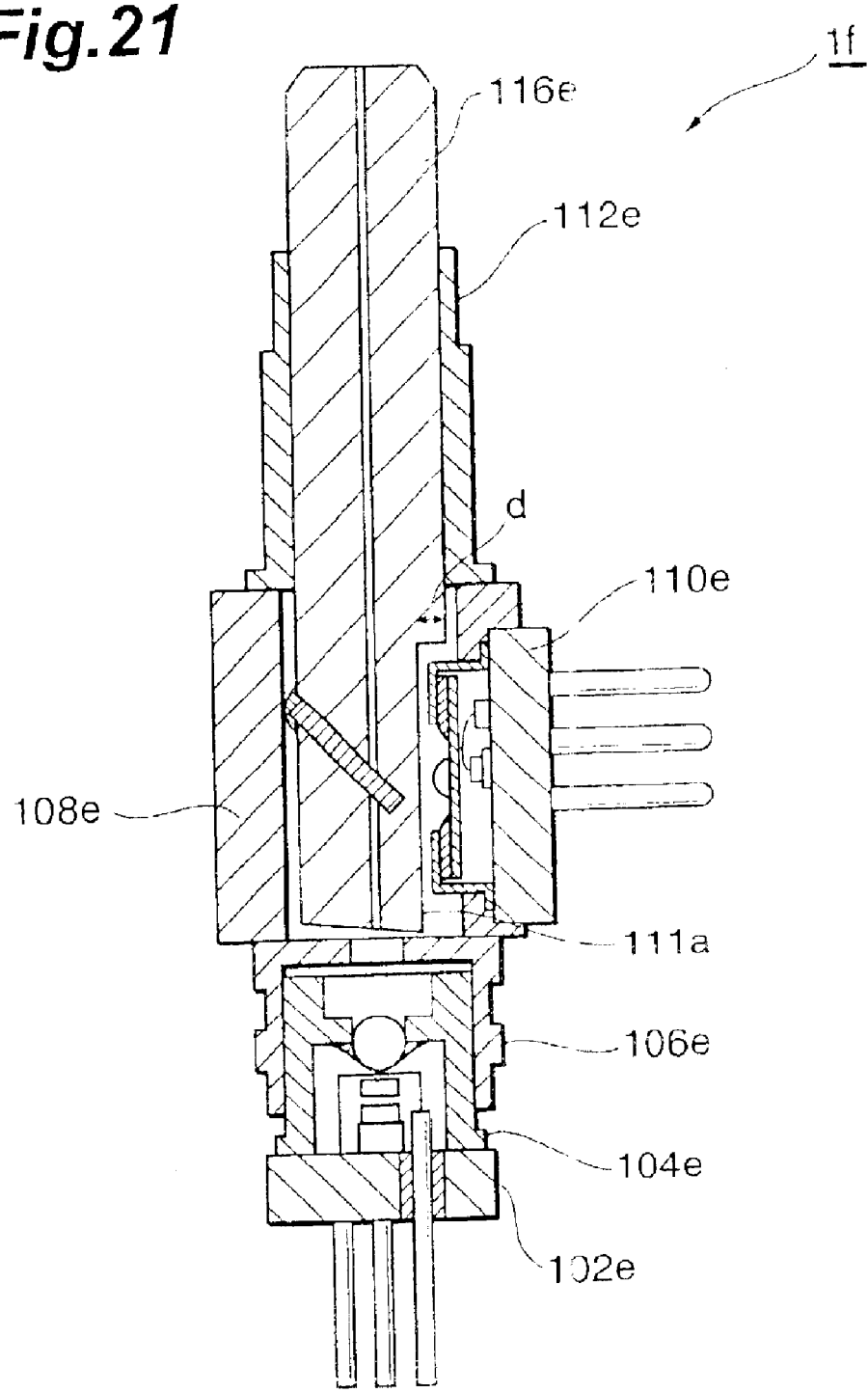
FIG. 21 is a side view showing a modification of the optical communications module according to the embodiment.

Referring to FIG. 21, the optical communications module 1f comprises a transmitting sub-assembly 102e, a guide member 104e, a positioning member 106e, a holding member 108e, a receiving sub-assembly 110e, a sleeve 112e and a ferrule part 116e. The angle α of inclination of the optical filter is approximately π/4 radians. In the ferrule part 116e of the optical communications module 1f, the side face of the ferrule is partly depressed by a depth of "d" at the part of the ferrule thereof facing the receiving sub-assembly 110e, to form a light emitting surface 111a that faces the receiving sub-assembly 110e. Accordingly, the distance between the optical filter of the ferrule part 116e and the receiving sub-assembly 110e can be shortened, thereby improving the optical coupling therebetween.

Figure 22:
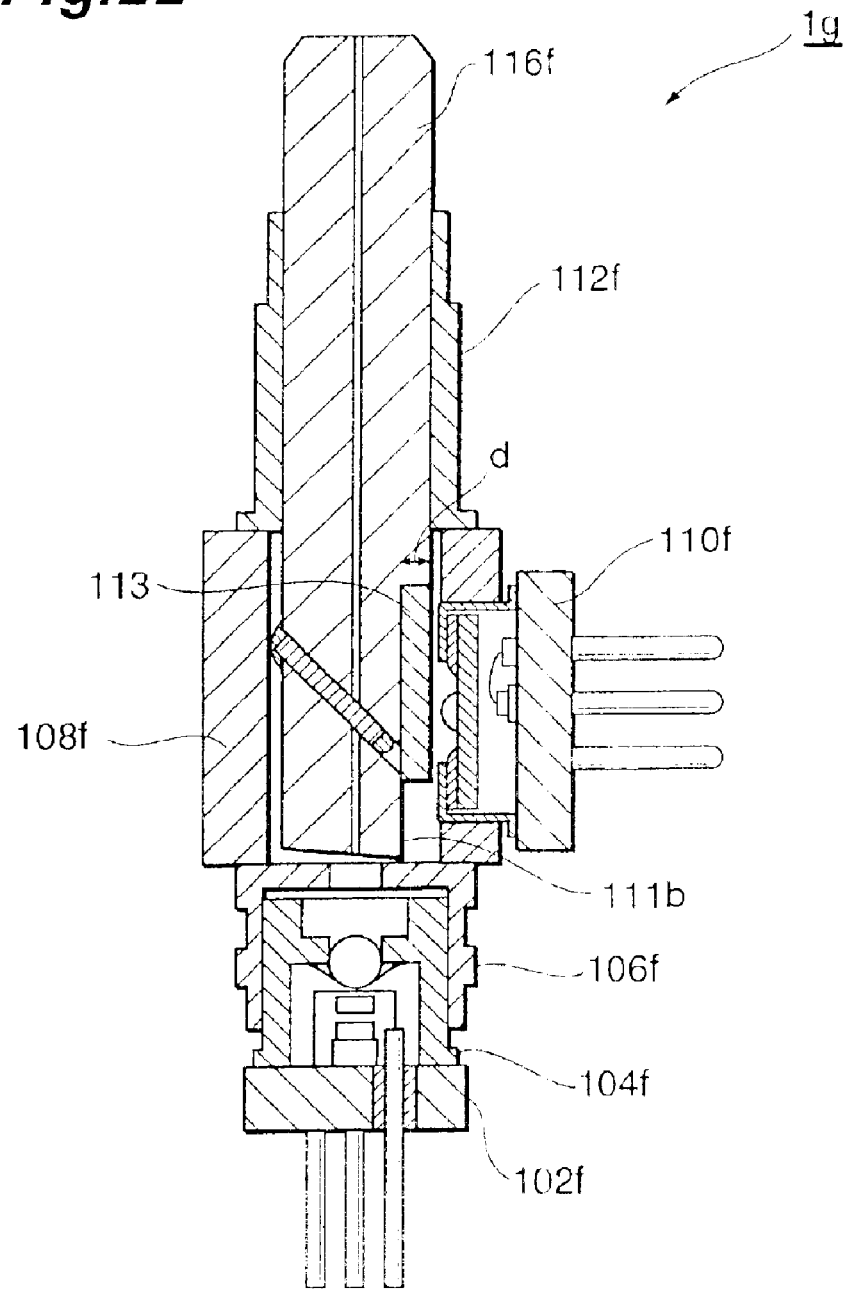
FIG. 22 is a side view showing a modification of the optical communications module according to the embodiment.

Referring to FIG. 22, the optical communications module 1g comprises a transmitting sub-assembly 102f, a guide member 104f, a positioning member 106f, a holding member 108f, a receiving sub-assembly 110f, a sleeve 112f and a ferrule part 116f. The angle α of inclination of the optical filter is approximately π/4 radians. In the optical communications module 1g, the ferule part 116f is partly cut by a depth of "d" at the side surface of the ferrule that faces the receiving sub-assembly 110f, thereby forming a light emitting surface 111b that faces the receiving sub-assembly 110f. An optical filter 113 may be provided on the light emitting surface 111b, and the optical filter 113 blocks light from the transmitting sub-assembly and transmits light to the receiving sub-assembly. This optical filter 113 can be formed by vacuum-evaporating a film on the light emitting surface 111b. The optical filter 113 allows the reduction of optical crosstalk in the optical communications module 1g. Furthermore, this optical filter can also be obtained by applying a glass substrate or polyimide film having a vacuum-evaporated film thereon to the light emitting surface. Moreover, the optical filter may be a semiconductor filter element. This semiconductor element has a structure of one or more semiconductor layer and this structure may include the lamination of several semiconductor layers with different band gaps.

In the various modifications as above, the angle of inclination of the optical filter is π/6 or π/4 radians; but, in the optical communications module of the present embodiment, the angle of inclination of the optical filter is not limited thereto.

(Second Embodiment)

Figure 23:
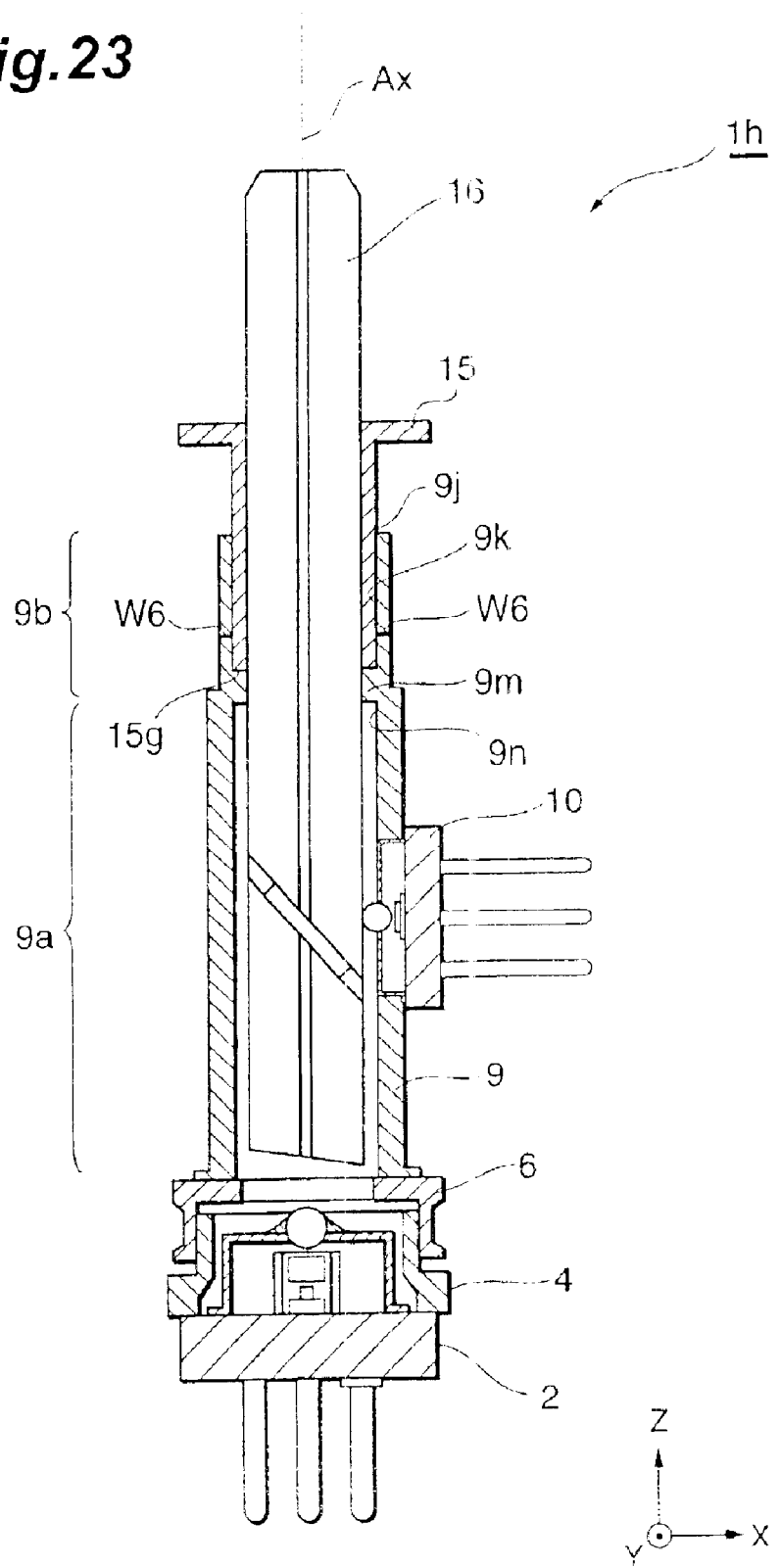
FIG. 23 is a sectional view showing the optical communications module according to the present invention.

FIG. 23 is a sectional view showing the optical communications module according to the present invention. The optical communications module 1h comprises a holding member 9 and sleeve member 15 instead of the abovementioned holding member 8 and sleeve member 12.

The holding member 9 has a holding portion 9a and a positioning portion 9b. These portions are arranged in a direction of a predetermined axis Ax. The holding portion 9a of the holding member 9 may have a structure identical or similar to the structure of the holding portion 8a of the holding member 8, but the structure of the holding portion 9a is not limited thereto.

The positioning portion 9b has a guide hole 9j that extends in a direction of the axis Ax. The positioning portion 9b is defined by a side face 9k (in the present embodiment, for example, the inner side faces of the guide hole 9j) extending in a direction of the axis Ax. The guide hole 9j guides the sleeve 15. Furthermore, in the present embodiment, the guide hole 9j communicates with the accommodating hole 9c. Positioning means are provided at each end of the side surface 9k, and allow the positioning of the sleeve 15 with respect to the direction of the Z axis. The positioning means, such as a projection 9m, is provided on the side surface 9k. This projection 9m may have an annular shape on the side surface 9k. The sleeve 15 abuts on the positioning means, such as the projection 9m, whereby the sleeve 15 is positioned with respect to the direction of the Z axis. The accommodating hole 9c extends in the direction of the axis Ax, and is provided so as to receive the ferrule part 16 therein. This accommodating hole 9c is defined by the inside surface 9n. In the present embodiment, the positioning means, such as the projection 9m, are provided at the boundary between the side surface 9k and side surface 9n.

Figure 24A:
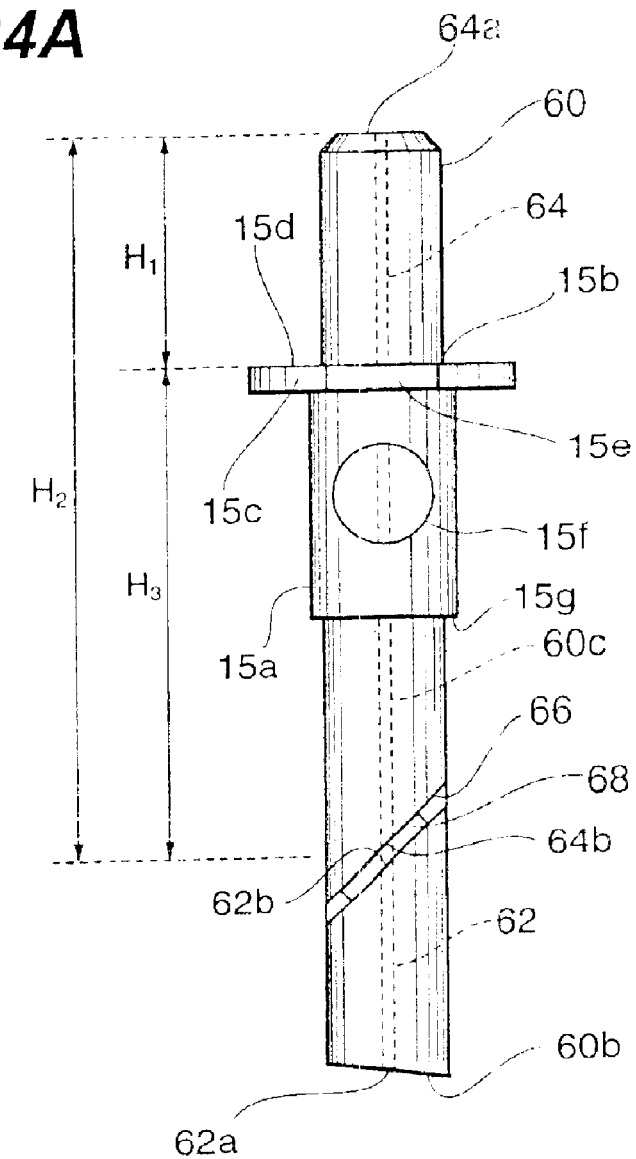
FIG. 24A is a side view showing the ferrule part used in the optical communications module as shown in FIG. 23.
Figure 24B:
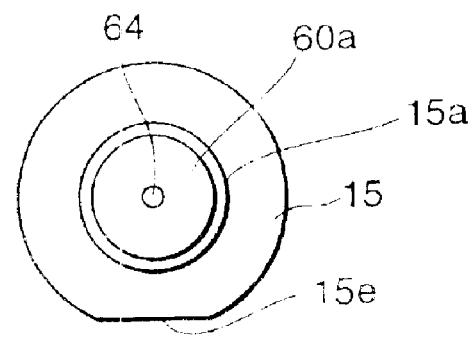
FIG. 24B is a front view showing the ferrule part.

FIG. 24A is a side view of the ferrule part for the optical communications module as shown in FIG. 23. FIG. 24B is a front view showing this ferrule part.

The ferrule part 17 comprises a sleeve 15, a ferrule 60, first and second optical fibers 62 and 64, a groove 66 and an optical part 68. The groove 66 has a pair of side surfaces provided so as to define the orientation of the optical part 68. The ferrule 60 has first and second end surfaces 60a and 60b intersecting the predetermined axis, and a hole 60c extending between the first end surface 60a and second end surface 60b. The hole 60c is spilt into two portions by the groove 66. The optical fiber 62 is accommodated in the first portion of the hole 60c. The optical fiber 62 has a first end 62a and a second end 62b. The first end 62a appears at the first end surface 60a of the ferrule. The second end 62b appears at one side surface of the groove 66. The optical fiber 64 is accommodated in the second portion of the hole 60c. The optical fiber 64 has a first end 64a and a second end 64b. The first end 64a appears at the second end surface 60b of the ferrule, and the second end 64b appears at the other side surface of the groove 66. The optical filter 68 has a pair of surfaces, and is provided in the groove 66. The second end portion 62b of the optical fiber 62 faces one surface of the optical filter 68. The second end portion 64b of the optical fiber 64 faces the other surface of the optical filter 68.

The sleeve 15 extends in a direction of the axis Ax, and comprises a tubular portion 15a. The tubular portion 15a comprises a holding hole 15b to hold the ferrule 60. Furthermore, the tubular portion 15a comprises a projection 15c on the outside surface of one end portion of the tubular portion 15a. The projection 15c functions as means for positioning the optical communications module 1h in the housing of the optical data link that includes the optical communications module 1h. In the present embodiment, the projection 15c has a flange shape that comprises a positioning surface 15d extending in a direction of an axis crossing the axis Ax. This positioning surface 15d abuts on the latching part of the optical data link to position the optical communications module 1h thereat.

The sleeve 15 is positioned so that the positioning surface 15d of the sleeve 15 is apart from one end of the ferrule 60 by a distance of $H_1$. It is desirable that this positioning be performed within a positional accuracy of approximately ±50 micrometers. According to experiments conducted by the inventors, such a positioning accuracy can be achieved by utilizing an assembling tool. Furthermore, the groove 66 of the ferrule 60 is positioned so that that groove is apart from the first end of the ferrule 60 by a distance of $H_2$. It is desirable that this positioning be performed within the accuracy of approximately ±50 microns. According to experiments conducted by the inventors, such a positioning accuracy can be achieved by using a dicing saw apparatus to form the groove 66 in the ferrule 60. Furthermore, the length of the sleeve 15 can be realized with an accuracy of approximately ±20 micrometers. By assemblying these parts, the position of the groove 66 taken from the end 64a is associated with the position of the contact surface 15g taken from the end 64a.

The sleeve 15 comprises mark means for indicating the orientation of the sleeve 15 with respect to the ferrule 60. For example, a cut-out portion 15e provided in the projecting portion 15c or an opening 15f provided in the tubular portion 15a serve as mark means.

The optical part 68 and the optical fibers 62 and 64 are mounted in the ferrule 60. This ferrule 60 is inserted into the sleeve 15 so that the orientation of the groove 66b of the ferrule 60 matches that of the marker means of the sleeve 15. Furthermore, this ferrule 60 is inserted into the sleeve 15 such that the position of the sleeve 15 is located at a distance $H_1$ taken from the end surface 60a of the ferrule 60. As a result, the position of the groove 66 of the ferrule 60 is associated with the position of the contact surface 15g of the sleeve 15.

The sleeve 15 comprises the contact surface 15g at the other end of the tubular portion 15a. The contact surface 15g is provided so as to abut against the projection 9m of the holding member 9. The contact surface 15g abuts against the projection 9m, and the ferrule part 17 is positioned with respect to the holding member 9.

Figure 25A:
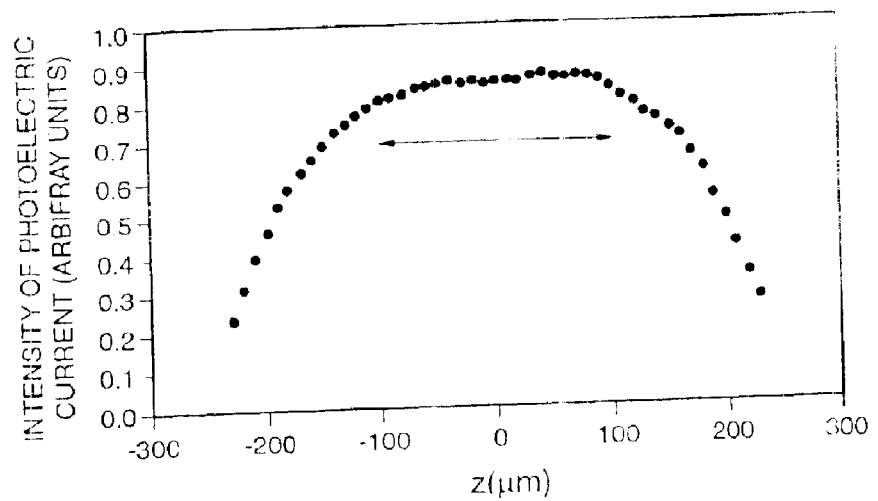
FIG. 25A is a view showing the tolerance with respect to the direction of the Z axis of the coordinate system shown in FIG. 23.
Figure 25B:
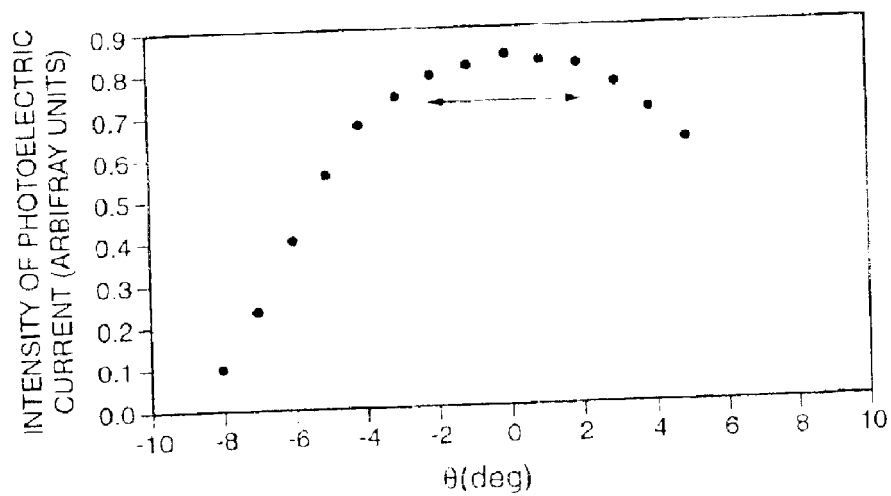
FIG. 25B is a view showing the tolerance with respect to the rotation of the ferrule part held by the holding member.

FIGS. 25A and 25B are diagrams showing the optical coupling tolerance with respect to the positioning of the ferrule part and receiving sub-assembly shown in FIG. 21, respectively. FIG. 25A shows the tolerance with respect to the direction of the Z axis of the coordinate system in FIG. 23, and FIG. 25B shows the tolerance with respect to rotation about the axis of the ferrule part held in the holding member (the axis Ax shown in FIG. 23, i.e., the optical axis of the optical fiber). These experiments are performed using light in the 1.55-micrometer wavelength band. In FIG. 25A, the horizontal axis shows the coordinate in the direction of the Z axis, and the vertical axis shows the photoelectric current from the receiving sub-assembly in arbitrary unit. These experiments reveal that a practical tolerance of ±100 micrometers can be achieved in a positional accuracy with respect to the direction of the Z axis. In FIG. 25B, the horizontal axis shows the rotational angle, and the vertical axis shows the photoelectric current from the receiving sub-assembly in arbitrary unit. These experiments reveal that a practical tolerance of ±2 degrees can be realized in a rotational accuracy range with respect to the angle of rotation.

According to the experimental results in FIGS. 25A and 25B, the positioning of the receiving sub-assembly 10 and ferrule part 17 can be realized in the structure of the optical communications module 1h as follows: the ferrule part 17 abuts on the holding member 9 after the ferrule part 17 is inserted into the holding member 9 such that the orientation of the ferrule part 17 is matched with that of the receiving sub-assembly 10 attached to the holding member 9. For example, the orientation of the ferrule part 17 with the receiving sub-assembly 10 can be accomplished using the mark means of the sleeve 15. Specifically, there is no need to directly align the receiving sub-assembly 10 and ferrule part 17 with each other.

(Third Embodiment)

Figure 26:
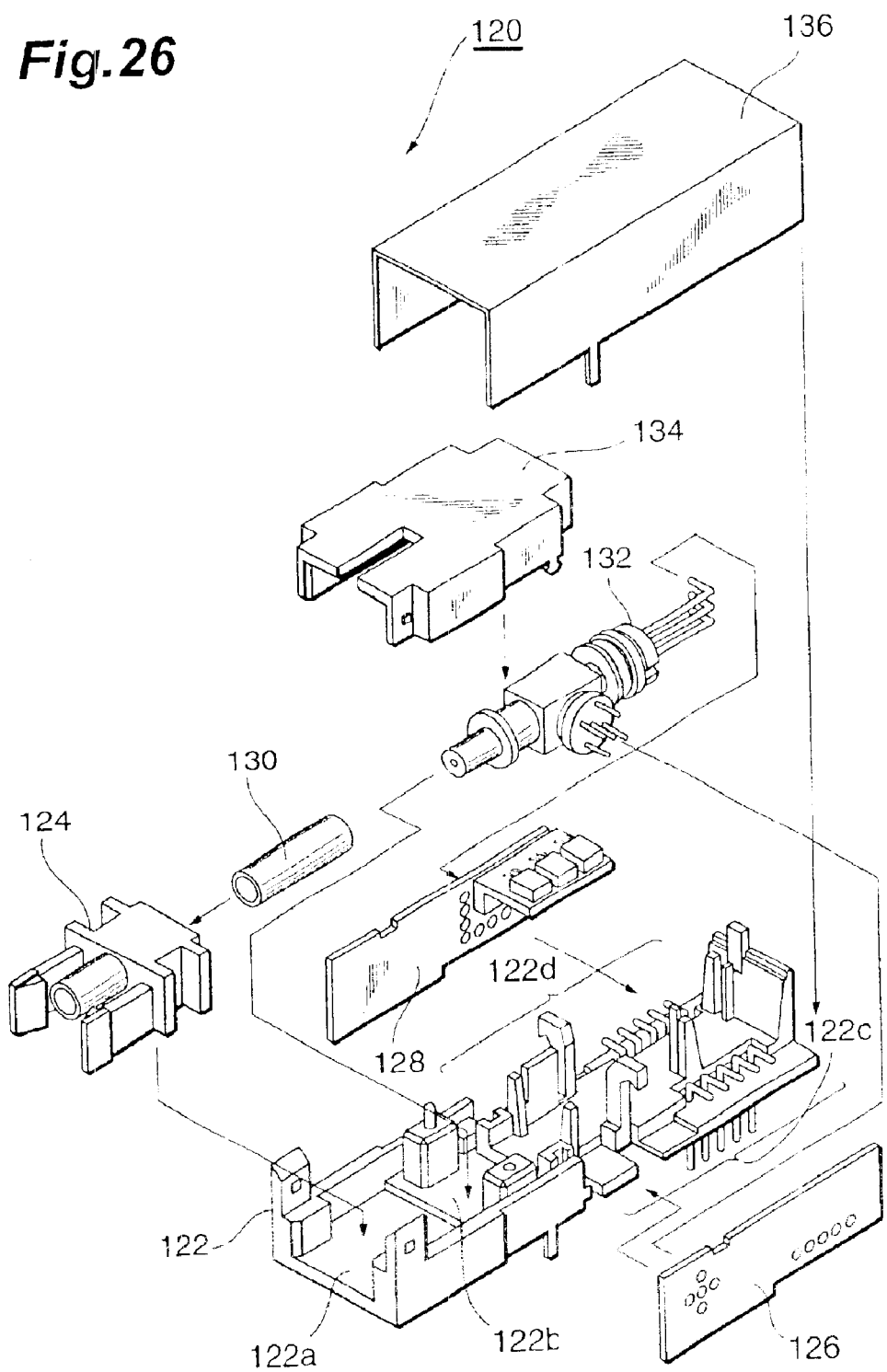
FIG. 26 is a perspective view showing the constituent parts of the optical data link of another embodiment of the present invention.

FIG. 26 is a perspective view showing the constituent parts of an optical data link according to another embodiment of the present invention. The optical data link 120 comprises a housing 122, a latching part 124, a first circuit board 126, a second circuit board 128, a sleeve 130, an optical communications module 132, a base part 134 and a cover 136.

The housing 122 comprises first and second accommodating portions 122a and 122b, and third and fourth accommodating portions 122c and 122d, and these portions are provided in a direction of a predetermined axis. The second accommodating portion 122b is provided between the third accommodating portion 122c and the fourth accommodating portion 122d. The latching part 124 is provided in the first accommodating portion 122a. The optical communications module 132 is provided in the second accommodating portion 122b so that the ferrule of the optical communications module 132 is inserted into the sleeve 130 and latching part 124. The fist circuit board 126 is provided in the third accommodating portion 122c. The second circuit board 128 is provided in the fourth accommodating portion 122d. The base part 134 is provided so that this part covers the latching part 124 and optical communications module 132 provided on the housing 122. The latching part 124 and optical communications module 132 are provided between the housing 122 and the base part 134. Consequently, the latching part 124 and optical communications module 132 can be positioned to each other. The cover 136 covers the latching part 124, first circuit board 126, second circuit board 128, sleeve 130, optical communications module 132 and base part 134 provided on the housing 122.

FIG. 27A is a perspective view showing the housing 122. The first accommodating portion 122a comprises a pair of guide columns 122e extending upward from the bottom portion of the housing 122. Latching parts 122f are provided on the guide columns 122e so that these latching parts can be latched to the base part 134. The first accommodating portion 122a has guide walls 122g which guide the latching part 124 and extend in the direction of the predetermined axis.

The second accommodating portion 122b has a pair of guide portions 122h and 122i extending upward from the bottom portion of the housing 122. The guide portion 122h is a projection extending upward, and the guide portion 122i is a hole extending downward. The guide portions 122h and 122i are provided so that these portions can engage with the base part 134. The second accommodating portion 122b has a pair of latching holes 122j that are provided so that these holes can latch with the base part 134.

The third accommodating portion 122c comprises a supporting surface 122k provided so that this surface 122k can support one side of the first circuit board 126, and also comprises an arm portion 122m which is provided so that this arm 122m portion can support the other side of the first circuit board 126. The third accommodating portion 122c also comprises a plurality of lead terminals 122n connected to the first circuit board 126. Each of the lead terminals 122n has an external lead protruding from the bottom surface of the housing 122, and internal leads bent at a predetermined distance taken from the upper surface of the housing so as to allow the connection of that internal lead to the first circuit board 126. The first circuit board 126 is positioned with respect to the housing 122 by the plurality of lead terminals 122n, the supporting surface 122k and the arm portion 122m.

The fourth accommodating portion 122d comprises a supporting surface 122p provided so that this surface 122p can support one side of the second circuit board 128, and an arm portion 122q which is provided so that this arm 122q portion can support the other side of the second circuit board 128. The fourth accommodating portion 122d also comprises a plurality of lead terminals 122r which are connected to the second circuit board 128. Each of the respective lead terminal 122r has an external lead protruding from the bottom surface of the housing 122, and an internal lead bent at a predetermined distance taken from upper surface to allow the connection of that internal lead to the second circuit board 128. The second circuit board 128 is positioned with respect to the housing by the plurality of lead terminals 122r, the supporting surface 122p and the arm portion 122q.

The housing 122 comprises a rear wall 122t. The rear wall 122t comprises a first supporting surface 122u provided so that this surface is adjacent to the third accommodating portion 122c, and a second supporting surface 122v provided so that this surface is adjacent to the fourth accommodating portion 122d. The supporting surface 122u can be utilized to support the second circuit board 126. The supporting surface 122v can be utilized to support the first circuit board 128. Furthermore, the housing 122 comprises supporting columns 122s used to support electronic components mounted on the circuit boards provided between the third and fourth accommodating portions 122c and 122d.

FIG. 27B is a perspective view showing the latching part 124. The latching part 124 has a pair of latching arms 124a that extend in the direction of the predetermined axis and are mated with an optical connector plug. The latching part 124 has a positioning surface 124b provided so as to cross the predetermined axis. The positioning surface (positioning surface 15d shown in FIG. 24) of the optical communications module 132 abuts on the positioning surface 124b. The latching part 124 further comprises a guide portion 124c. The guide portion 124c extends in the direction of the predetermined axis and guides the optical connector between the pair of latching arms 124a. A main body portion 124d is provided between the guide portion 124c and positioning surface 124b. The latching part 124 has a hole passing in a direction of the predetermined axis through the guide portion 124c and main body portion 124d to the positioning surface 124b.

FIG. 27C is a perspective view showing the optical communications module 132. The optical communications module 132 is oriented in the housing 122 so that the lead terminals of the receiving sub-assembly can be connected to the first circuit board 126. In the optical communications module 132, the lead terminals of the transmitting sub-assembly are bent so as to be connected the lead terminals to the second circuit board 128.

FIG. 27D is a perspective view showing the base part 134. The base part 134 has a pair of side wall portions 134a that extend in the direction of the predetermined axis. Each side wall part 134a has a latching portion 134b, and these latching parts 134b latch with latching portions 122f provided on the wall surfaces of the guide columns 122e, respectively. The base part 134 comprises a guide projection 134c faced downward on one of the pair of side wall portions 134a, and a guide hole 134d faced downward on the other of the pair of side wall portions 134a. The guide projection 134c and guide hole 134d are engaged with guide portions 122h and 122i of the housing 122, respectively. Furthermore, latching pieces 134g faced downward are provided on the pair of side wall portions 134a. The latching pieces 134g are latched to the latching holes 122j provided in the housing 122. The base part 134 also comprises a ceiling portion 134e provided so as to connect the pair of side wall portions 134a to each other. A cut-out portion 134f is formed in the ceiling part 134e, and the cut-out portion 134f extends from one side of the ceiling part 134e in a direction of the predetermined axis. The cut-out portion 134f is provided in order to position the optical connector plug, or to prevent the rotation of the optical connector plug. An SC connector is one example of the optical connector plug.

Figure 28A:
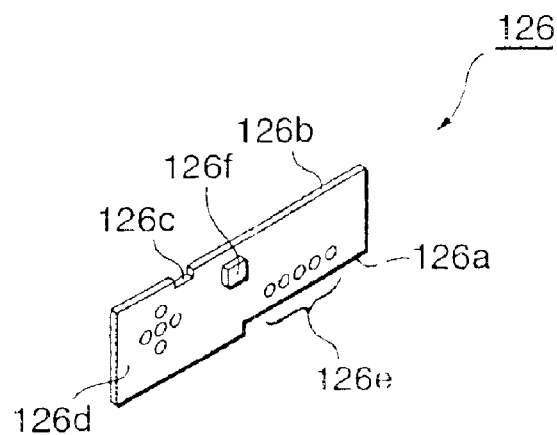
FIG. 28A is a perspective view showing a first circuit board.

FIG. 28A is a perspective view showing the first circuit board 126. The first circuit board 126 comprises a pair of edges 126a and 126b extending in the direction of the predetermined axis. The edge 126a is provided so as to be supported by the supporting surface 122k of the housing 122. The edge 126b is provided so as to be supported by the supporting arm 122m of the housing 122. A positioning portion, such as a recess 126c, is provided in the edge 126b to avoid shifting the position of the supported board 126. The supporting arm 122m is engaged in the recess 126c. The first circuit board 126 comprises terminal holes 126d connected to the lead terminals of the receiving sub-assembly (indicated by reference number 132a in FIG. 24), and terminal holes 126e connected to the lead terminals 122n of the housing 122. The first circuit board 126 comprises electronic elements 126f connected to the lead terminals of the receiving sub-assembly.

Figure 28B:
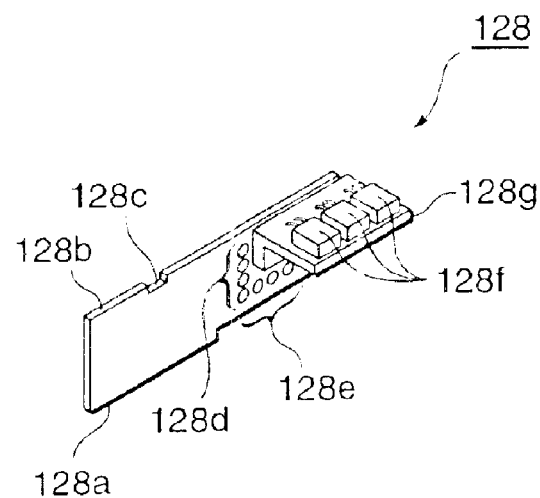
FIG. 28B is a perspective view showing a second circuit board.

FIG. 28B is a perspective view showing the second circuit board 128. The second circuit board 128 comprises a pair of edges 128a and 128b extend in a direction of the predetermined axis. The edge 128a is provided so as to be supported by the supporting surface 122p of the housing 122. The edge 128b is provided so as to be supported by the supporting arm 122q of the housing 122. A positioning portion, such as a recess 128c, is provided in the edge 128b. The supporting arm 122q is engaged in the recess 128c. The second circuit board 128 comprises terminal holes 128d connected to the lead terminals of the transmitting sub-assembly (reference number 132b in FIG. 24), and terminal holes 128e connected to the lead terminals 122r of the housing 122. The second circuit board comprises electronic elements that are connected to the lead terminals of the transmitting sub-assembly. The electronic elements 128f are mounted on the mounting member 128g secured to the second circuit board 128. The mounting member 128g is supported by the supporting columns 122s of the housing 122.

Figure 28C:
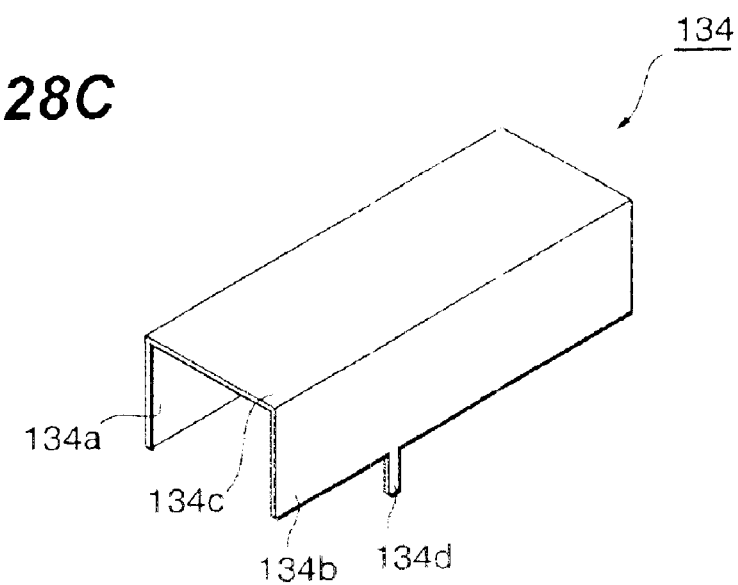
FIG. 28C is a perspective view showing the cover.

FIG. 28C is a perspective view showing the cover 134. The cover 134 is formed from a conductive material such as metal. The cover 134 comprises a pair of side walls 134a and 134b and a ceiling 134c. The side walls 134a and 134b extend in the direction of the predetermined axis. The ceiling 134c connects the side walls 134a ad 134b to each other. A ground terminal 134d is provided on each of the pair of side walls 134a and 134b.

As described above, provided are a ferrule part and an optical communications module having a structure that allow the alignment of the transmitting sub-assembly with the optical fiber in the ferrule part without the interposition of an optical filter.

Having described and illustrated the principle of the invention in preferred embodiments thereof, it is appreciated by those having skill in the art that the invention can be modified or changed in arrangement and detail without departing from such principles. For example, positioning of the holding member and ferrule part can be accomplished by means of one surface of the inside surface and outside surface of the holding member and the other surface of the inside surface and outside surface of the ferrule part. Further, positioning of the guide member and positioning member can be accomplished by means of one surface of the inside surface and outside surface of the guide member and the other surface of the inside surface and outside surface of the positioning member. Furthermore, examples of combinations of transmission wavelengths and reception wavelengths in the optical communications module include $\lambda_1/\lambda_2$=1.3/1.55 micrometers, 1.55/1.3 micrometers, 1.3/1.3 micrometers, 1.3/1.49 micrometers and the like. However, the application of the present invention should not be understood as being limited to these combinations. We therefore claim all modifications and variations coming within the spirit and scope of the following claims.

What is claimed is:

1. A ferrule part comprising:

a ferrule having first and second end faces and a groove, said first and second end faces intersecting a first axis, said groove extending along a second axis, and said second axis intersecting said first axis to form an acute angle, said groove being provided along a plane defined by said second axis and a third axis perpendicular to said first and second axes, said groove extending across said ferrule along said second axis;

an optical part provided in said groove so as to intersect said first axis, said optical part having a pair of surfaces, said optical part being capable of transmitting a part of light incident on said one surface of said pair of surfaces of said optical part, and said optical part being capable of reflecting a part of light incident on said one surface of said pair of surfaces of said optical part to form a reflected light component from said incident light;

a first optical fiber supported in said ferrule, said first optical fiber having one end, said one end of said first optical fiber facing said one surface of said pair of surfaces of said optical part; and a second optical fiber supported in said ferrule, said second optical fiber having one end, said one end of said second optical fiber facing the other face of said pair of faces of said optical part;

wherein said ferrule transmits said reflected light component and further includes a side surface through which said transmitted light passed.

2. The ferrule part according to claim 1, wherein said optical part includes an optical filter, said optical filter is capable of transmitting light of a first wavelength component of light propagating in said first and second optical fibers, and said optical filter is capable of reflecting light of a second wavelength component of light propagating in said first and second optical fibers.

3. The ferrule part according to claim 1, wherein said optical part includes a half-mirror.

4. The ferrule part according to claim 1, wherein said optical part includes a WDM filter.

5. A ferrule part comprising:

a ferrule having first and second end faces and a groove, said first and second end faces intersecting a first axis, said groove extending along a second axis, and said second axis intersecting said first axis to form an acute angle, said groove being provided along a plane defined by said second axis and a third axis perpendicular to said first and second axes, said groove extending across said ferrule along said second axis, said groove having a pair of side surface extending along said plane;

an optical part provided in said groove so as to intersect said first axis, said optical part having a pair of surfaces, said optical part being capable of transmitting a part of light incident on said one surface of said pair of surfaces of said optical part, and said optical part being capable of reflecting a part of light incident on said one surface of said pair of surfaces of said optical part;

a first optical fiber supported in said ferrule, said first optical fiber having one end, said one end of said first optical fiber facing said one surface of said pair of surfaces of said optical part; and a second optical fiber supported in said ferrule, said second optical fiber having one end, said one end of said second optical fiber facing the other face of said pair of faces of said optical part;

wherein said ferrule is made of material that is capable of transmitting light propagating in said first and second optical fibers, wherein said groove has a pair of side faces extending along said plane, wherein said ferrule has a hole extends in a direction of said first axis, and wherein said hole has first and second portions, said first portion extending from said first end face of said ferrule to said one side face of said groove, and said second portion extending from said second end face of said ferrule to the other side face of said groove, wherein said one end of said first optical fiber terminates at an end of said first portion of said hole and said one end of said second optical fiber terminates at an end of said second portion of said hole.

6. The ferrule part according to claim 1, wherein said ferrule comprise a depression provided in said side surface thereof; and wherein said groove extends across said depression.

7. The ferrule part according to claim 1, wherein said ferrule comprises a depression provided in the side surface thereof, wherein said depression comprises a pair of edges and a surface, each edge extends in a direction of said first axis, and said surface extends from one of said pair of edges to the other of said pair of edges, wherein said groove extends from one of said pair of edges of said depression to the other of said pair of edges, wherein said groove extends across said surface of the depression, and said groove has a pair of ends provided at each edge of said depression, and wherein said one end of said groove is located on said one edge of said depression at a position that differs from a position of an intersection between said other edge of said depression and a perpendicular line dropped from a position of said other end of said groove to said one edge of said depression.

8. The ferrule part according to claim 1, wherein said ferrule comprises another depression provided in said side surface thereof, said other depression comprises a surface intersecting said surface of said depression.

9. The ferrule part according to claim 1, wherein said ferrule made of optical glass.

10. A ferrule part comprising:

a ferrule having first and second end faces and a groove, said first and second end faces intersecting a first axis, said groove extending along a second axis, and said second axis intersecting said first axis to form an acute angle, said groove being provided along a plane defined by said second axis and a third axis perpendicular to said firs and second axes, said groove extending across said ferrule along said second axis, said groove having a pair of side surfaces extending along said plane;

an optical part provided in said groove so as to intersect said first axis, said optical part having a pair of surfaces, said optical part being capable of transmitting a part of light incident on said one surface of said pair of surfaces of said optical part, and said optical part being capable of reflecting a part of light incident on said one surface of said pair of surfaces of said optical part;

a first optical fiber supported in said ferrule, said first optical fiber having one end, said one end of said first optical fiber facing said one surface of said pair of surfaces of said optical part; and a second optical fiber supported in said ferrule, said second optical fiber having one end, said one end of said second optical fiber facing the other face of said pair of faces of said optical part;

wherein said ferrule is made of material that is capable of transmitting light propagating in said first and second optical fibers, wherein a maximum width of said side surfaces of said groove is greater than a maximum width of said surfaces of said optical part and both maximum widths are taken in a direction of said second axis.

11. The ferrule part according to claim 1, further comprising a sleeve holding said ferrule;

wherein said sleeve is positioned with respect to said first end face of said ferrule, and wherein said optical part is positioned with respect to said first end face of said ferrule.

12. An optical communications module comprising: a ferrule part according to claim 1;

a receiving sub-assembly optically coupled to said optical part of said ferrule part; and a transmitting sub-assembly optically coupled to said first optical fiber at said first end face of said ferrule part.

13. The optical communications module according to claim 12, further comprising a holding member having a receiving hole and a positioning hole, said receiving hole extending in a direction of a predetermined axis, said receiving hole receiving said ferrule part therein, said positioning hole being provided to extend in a direction of an axis intersecting said predetermined axis, said positioning hole communicating with said receiving hole, and said positioning hole being provided to position said receiving sub-assembly.

14. An optical communications module comprising:

a ferrule part according to claim 11;

a receiving sub-assembly optically coupled to said optical part of said ferrule part;

a transmitting sub-assembly optically coupled to said first optical fiber at said first end face of said ferrule part; and a holding member having a receiving hole and a positioning hole, said receiving hole extending in a direction of a predetermined axis, said receiving hole receiving said ferrule part therein, said positioning hole being provided to extend in a direction of an axis intersecting said predetermined axis, said positioning hole communicating with said receiving hole, and said positioning hole being provided to position said receiving sub-assembly;

wherein said holding member has a side face extending in a direction of said predetermined axis, and said side face has a positioning portion, and wherein said positioning portion of said holding member positions said sleeve of said ferrule part.

15. The optical communications module according to claim 14, further comprising a positioning member having a mounting surface, said mounting surface extending along a plane, said plane intersecting said predetermined axis, wherein said holding member comprises an end portion having a sliding surface, said sliding surface extends along a plane intersecting said predetermined axis, and said sliding surface faces said mounting surface of said positioning member.

16. The optical communications module according to claim 13, wherein said ferrule part has a sleeve holding said ferrule, wherein said holding member has a holding portion and a positioning portion, wherein said holding portion and said positioning portion are provided in a direction of said predetermined axis, wherein said holding portion has first and second ends, wherein said receiving hole extends from the first end of said holding portion to the second end thereof, wherein said positioning portion has a guide hole guiding said sleeve, and wherein said guide hole communicates with said receiving hole at said second end.

17. The optical communications module according to claim 13, wherein a gap is provided between said ferrule part and an inner surface of said receiving hole of said holding member.

18. The optical communications module according to claim 13, further comprising a positioning member having a side face, said side face extending in a direction of said predetermined axis, wherein said transmitting sub-assembly comprises a mounting member, a semiconductor light generating element mounted on said mounting member, and a lead terminal provided in said mounting member, and wherein said lead terminal is connected to said semiconductor light generating element, said optical communications module further comprising a guide member mounted on said mounting member, said guide member having a guide surface, said guide surface extending in a direction of said predetermined axis, and said guide surface facing said side face of said positioning member.

19. The optical communications module according to claim 13, wherein said receiving sub-assembly has a mounting member for mounting a semiconductor light receiving element, a cover member mounted on said mounting member, and a lead terminal provided in said mounting member, and wherein said lead terminal is connected to said semiconductor light receiving element, and wherein said semiconductor light receiving element receives light reflected by said optical part.

20. The optical communications module according to claim 19, wherein said receiving sub-assembly has another optical part provided between said semiconductor light receiving element and said optical part of said ferrule part, and wherein said other optical part includes one of an optical aperture and an optical filter.

* * * * *